United States Patent
Ma et al.

(10) Patent No.: US 8,491,967 B2
(45) Date of Patent: *Jul. 23, 2013

(54) IN-SITU CHAMBER TREATMENT AND DEPOSITION PROCESS

(75) Inventors: Paul F. Ma, Santa Clara, CA (US);
Joseph F. Aubuchon, San Jose, CA (US); Mei Chang, Saratoga, CA (US);
Steven H. Kim, Union City, CA (US);
Dien-Yeh Wu, San Jose, CA (US);
Norman M. Nakashima, Sunnyvale, CA (US); Mark Johnson, San Jose, CA (US); Roja Palakodeti, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1100 days.

This patent is subject to a terminal disclaimer.

(21) Appl. No.: 12/206,705

(22) Filed: Sep. 8, 2008

(65) Prior Publication Data
US 2010/0062614 A1    Mar. 11, 2010

(51) Int. Cl.
*B05D 5/12* (2006.01)

(52) U.S. Cl.
USPC .................. 427/301; 427/299; 427/248.1

(58) Field of Classification Search
None
See application file for complete search history.

(56) References Cited

U.S. PATENT DOCUMENTS

| | | | |
|---|---|---|---|
| 4,389,973 A | 6/1983 | Suntola et al. |
| 4,413,022 A | 11/1983 | Suntola et al. |
| 4,486,487 A | 12/1984 | Skarp et al. |
| 4,693,208 A | 9/1987 | Sakai et al. |
| 5,290,609 A | 3/1994 | Horiike et al. |
| 5,306,666 A | 4/1994 | Izumi et al. |
| 5,374,570 A | 12/1994 | Nasu et al. |
| 5,526,244 A | 6/1996 | Bishop |
| 5,711,811 A | 1/1998 | Suntola et al. |
| 5,834,372 A | 11/1998 | Lee et al. |

(Continued)

FOREIGN PATENT DOCUMENTS

| | | |
|---|---|---|
| EP | 0 464 515 | 1/1992 |
| EP | 0 973 189 | 1/2000 |

(Continued)

OTHER PUBLICATIONS

Argarwal, et al. "Challenges in Integrating the High-K Gate Dielectric Film to the Conventional CMOS Process Flow," Mat. Sec. Soc. Sump. Proc. vol. 670 (2001).

(Continued)

*Primary Examiner* — Joseph Miller, Jr.
(74) *Attorney, Agent, or Firm* — Patterson & Sheridan, LLP

(57) ABSTRACT

Embodiments of the invention provide a method for treating the inner surfaces of a processing chamber and depositing a material on a during a vapor deposition process, such as atomic layer deposition (ALD) or by chemical vapor deposition (CVD). In one embodiment, the inner surfaces of the processing chamber and the substrate may be exposed to a reagent, such as a hydrogenated ligand compound during a pretreatment process. The hydrogenated ligand compound may be the same ligand as a free ligand formed from the metal-organic precursor used during the subsequent deposition process. The free ligand is usually formed by hydrogenation or thermolysis during the deposition process. In one example, the processing chamber and substrate are exposed to an alkylamine compound (e.g., dimethylamine) during the pretreatment process prior to conducting the vapor deposition process which utilizes a metal-organic chemical precursor having alkylamino ligands, such as pentakis(dimethylamino)tantalum (PDMAT).

2 Claims, 4 Drawing Sheets

U.S. PATENT DOCUMENTS

| | | | |
|---|---|---|---|
| 5,916,365 A | 6/1999 | Sherman |
| 5,923,056 A | 7/1999 | Lee et al. |
| 5,989,345 A | 11/1999 | Hatano et al. |
| 6,001,420 A | 12/1999 | Mosely et al. |
| 6,013,553 A | 1/2000 | Wallace et al. |
| 6,015,590 A | 1/2000 | Suntola et al. |
| 6,015,917 A | 1/2000 | Bhandari et al. |
| 6,020,243 A | 2/2000 | Wallace et al. |
| 6,060,755 A | 5/2000 | Ma et al. |
| 6,084,302 A | 7/2000 | Sandhu |
| 6,124,158 A | 9/2000 | Dautartas et al. |
| 6,139,700 A | 10/2000 | Kang et al. |
| 6,144,060 A | 11/2000 | Park et al. |
| 6,174,809 B1 | 1/2001 | Kang et al. |
| 6,197,683 B1 | 3/2001 | Kang et al. |
| 6,200,893 B1 | 3/2001 | Sneh |
| 6,203,613 B1 | 3/2001 | Gates et al. |
| 6,207,302 B1 | 3/2001 | Sugiura et al. |
| 6,207,487 B1 | 3/2001 | Kim et al. |
| 6,238,734 B1 | 5/2001 | Senzaki et al. |
| 6,270,572 B1 | 8/2001 | Kim et al. |
| 6,284,646 B1 | 9/2001 | Leem et al. |
| 6,287,965 B1 | 9/2001 | Kang et al. |
| 6,291,283 B1 | 9/2001 | Wilk |
| 6,291,867 B1 | 9/2001 | Wallace et al. |
| 6,294,836 B1 | 9/2001 | Paranjpe et al. |
| 6,297,172 B1 | 10/2001 | Kashiwagi et al. |
| 6,297,539 B1 | 10/2001 | Ma et al. |
| 6,299,294 B1 | 10/2001 | Regan |
| 6,305,314 B1 | 10/2001 | Sneh et al. |
| 6,342,277 B1 | 1/2002 | Sherman |
| 6,348,376 B2 | 2/2002 | Lim et al. |
| 6,348,386 B1 | 2/2002 | Gilmer |
| 6,358,829 B2 | 3/2002 | Yoon et al. |
| 6,365,502 B1 | 4/2002 | Paranjpe et al. |
| 6,372,598 B2 | 4/2002 | Kang et al. |
| 6,379,748 B1 | 4/2002 | Bhandari et al. |
| 6,391,785 B1 | 5/2002 | Satta et al. |
| 6,391,803 B1 | 5/2002 | Kim et al. |
| 6,395,650 B1 | 5/2002 | Callegari et al. |
| 6,399,208 B1 | 6/2002 | Baum et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,420,279 B1 | 7/2002 | Ono et al. |
| 6,428,859 B1 | 8/2002 | Chiang et al. |
| 6,444,263 B1 | 9/2002 | Paranjpe et al. |
| 6,451,119 B2 | 9/2002 | Sneh et al. |
| 6,451,695 B2 | 9/2002 | Sneh |
| 6,452,229 B1 | 9/2002 | Krivokapic |
| 6,458,701 B1 | 10/2002 | Chae et al. |
| 6,468,924 B2 | 10/2002 | Lee et al. |
| 6,475,276 B1 | 11/2002 | Elers et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,498,091 B1 | 12/2002 | Chen et al. |
| 6,511,539 B1 | 1/2003 | Raaijmakers et al. |
| 6,524,952 B1 | 2/2003 | Srinivas et al. |
| 6,534,395 B2 | 3/2003 | Werkhoven et al. |
| 6,548,424 B2 | 4/2003 | Putkonen et al. |
| 6,551,929 B1 | 4/2003 | Kori et al. |
| 6,569,501 B2 | 5/2003 | Chiang et al. |
| 6,585,823 B1 | 7/2003 | Van Wijck et al. |
| 6,593,484 B2 | 7/2003 | Yasuhara et al. |
| 6,596,602 B2 | 7/2003 | Iizuka et al. |
| 6,596,643 B2 | 7/2003 | Chen et al. |
| 6,599,572 B2 | 7/2003 | Saanila et al. |
| 6,607,973 B1 | 8/2003 | Jeon |
| 6,607,976 B2 | 8/2003 | Chen et al. |
| 6,620,723 B1 | 9/2003 | Byun et al. |
| 6,627,995 B2 | 9/2003 | Paranjpe et al. |
| 6,630,201 B2 | 10/2003 | Chiang et al. |
| 6,632,279 B1 | 10/2003 | Ritala et al. |
| 6,645,847 B2 | 11/2003 | Paranjpe et al. |
| 6,660,622 B2 | 12/2003 | Chen et al. |
| 6,660,659 B1 | 12/2003 | Kraus et al. |
| 6,674,138 B1 | 1/2004 | Halliyal et al. |
| 6,686,271 B2 | 2/2004 | Raaijmakers et al. |
| 6,713,846 B1 | 3/2004 | Senzaki |
| 6,718,126 B2 | 4/2004 | Lei |
| 6,720,027 B2 | 4/2004 | Yang et al. |
| 6,740,585 B2 | 5/2004 | Yoon et al. |
| 6,772,072 B2 | 8/2004 | Ganguli et al. |
| 6,773,507 B2 | 8/2004 | Jallepally et al. |
| 6,777,352 B2 | 8/2004 | Tepman et al. |
| 6,784,096 B2 | 8/2004 | Chen et al. |
| 6,790,773 B1 | 9/2004 | Drewery et al. |
| 6,800,173 B2 | 10/2004 | Chiang et al. |
| 6,803,272 B1 | 10/2004 | Halliyal et al. |
| 6,812,126 B1 | 11/2004 | Paranjpe et al. |
| 6,815,285 B2 | 11/2004 | Choi et al. |
| 6,821,563 B2 | 11/2004 | Yudovsky |
| 6,831,004 B2 | 12/2004 | Byun et al. |
| 6,831,021 B2 | 12/2004 | Chua et al. |
| 6,838,125 B2 | 1/2005 | Chung et al. |
| 6,846,516 B2 | 1/2005 | Yang et al. |
| 6,849,545 B2 | 2/2005 | Mak et al. |
| 6,858,547 B2 | 2/2005 | Metzner et al. |
| 6,861,356 B2 | 3/2005 | Matsuse et al. |
| 6,875,271 B2 | 4/2005 | Glenn et al. |
| 6,893,915 B2 | 5/2005 | Park et al. |
| 6,897,106 B2 | 5/2005 | Park et al. |
| 6,905,541 B2 | 6/2005 | Chen et al. |
| 6,905,737 B2 | 6/2005 | Verplancken et al. |
| 6,911,391 B2 | 6/2005 | Yang et al. |
| 6,915,592 B2 | 7/2005 | Guenther |
| 6,916,398 B2 | 7/2005 | Chen et al. |
| 6,924,191 B2 | 8/2005 | Liu et al. |
| 6,930,060 B2 | 8/2005 | Chou et al. |
| 6,936,906 B2 | 8/2005 | Chung et al. |
| 6,939,801 B2 | 9/2005 | Chung et al. |
| 6,951,804 B2 | 10/2005 | Seutter et al. |
| 6,953,742 B2 | 10/2005 | Chen et al. |
| 6,955,211 B2 | 10/2005 | Ku et al. |
| 6,958,296 B2 | 10/2005 | Chen et al. |
| 6,969,539 B2 | 11/2005 | Gordon et al. |
| 6,972,267 B2 | 12/2005 | Cao et al. |
| 6,974,771 B2 | 12/2005 | Chen et al. |
| 6,998,014 B2 | 2/2006 | Chen et al. |
| 7,005,697 B2 | 2/2006 | Batra et al. |
| 7,026,238 B2 | 4/2006 | Xi et al. |
| 7,041,335 B2 | 5/2006 | Chung |
| 7,049,226 B2 | 5/2006 | Chung et al. |
| 7,067,422 B2 | 6/2006 | Nakamura et al. |
| 7,067,439 B2 | 6/2006 | Metzner et al. |
| 7,081,271 B2 | 7/2006 | Chung et al. |
| 7,081,409 B2 | 7/2006 | Kang et al. |
| 7,094,680 B2 | 8/2006 | Seutter et al. |
| 7,094,685 B2 | 8/2006 | Yang et al. |
| 7,098,131 B2 | 8/2006 | Kang et al. |
| 7,118,779 B2 | 10/2006 | Verghese et al. |
| 7,186,385 B2 | 3/2007 | Ganguli et al. |
| 7,204,886 B2 | 4/2007 | Chen et al. |
| 7,208,413 B2 | 4/2007 | Byun et al. |
| 7,211,508 B2 | 5/2007 | Chung et al. |
| 7,408,225 B2 | 8/2008 | Shinriki et al. |
| 2001/0000866 A1 | 5/2001 | Sneh et al. |
| 2001/0002280 A1 | 5/2001 | Sneh |
| 2001/0009140 A1 | 7/2001 | Bondestam et al. |
| 2001/0009695 A1 | 7/2001 | Saanila et al. |
| 2001/0021589 A1 | 9/2001 | Wilk |
| 2001/0024387 A1 | 9/2001 | Raaijmakers et al. |
| 2001/0025979 A1 | 10/2001 | Kim et al. |
| 2001/0028924 A1 | 10/2001 | Sherman |
| 2001/0029092 A1 | 10/2001 | Park et al. |
| 2001/0029891 A1 | 10/2001 | Oh et al. |
| 2001/0034123 A1 | 10/2001 | Jeon et al. |
| 2001/0041250 A1 | 11/2001 | Werkhoven et al. |
| 2001/0050039 A1 | 12/2001 | Park |
| 2001/0054730 A1 | 12/2001 | Kim et al. |
| 2001/0054769 A1 | 12/2001 | Raaijmakers et al. |
| 2002/0000598 A1 | 1/2002 | Kang et al. |
| 2002/0005556 A1 | 1/2002 | Cartier et al. |
| 2002/0007790 A1 | 1/2002 | Park |
| 2002/0008297 A1 | 1/2002 | Park et al. |

| | | | | | | |
|---|---|---|---|---|---|---|
| 2002/0009544 A1 | 1/2002 | Mcfeely et al. | | 2003/0072884 A1 | 4/2003 | Zhang et al. |
| 2002/0014647 A1 | 2/2002 | Seidl et al. | | 2003/0072975 A1 | 4/2003 | Shero et al. |
| 2002/0015790 A1 | 2/2002 | Baum et al. | | 2003/0079686 A1* | 5/2003 | Chen et al. ................. 118/715 |
| 2002/0020869 A1 | 2/2002 | Park et al. | | 2003/0082296 A1 | 5/2003 | Elers et al. |
| 2002/0021544 A1 | 2/2002 | Cho et al. | | 2003/0082300 A1 | 5/2003 | Todd et al. |
| 2002/0029092 A1 | 3/2002 | Gass | | 2003/0082301 A1* | 5/2003 | Chen et al. ............ 427/255.28 |
| 2002/0031618 A1 | 3/2002 | Sherman | | 2003/0082307 A1* | 5/2003 | Chung et al. ................. 427/402 |
| 2002/0041931 A1 | 4/2002 | Suntola et al. | | 2003/0087520 A1 | 5/2003 | Chen et al. |
| 2002/0043666 A1 | 4/2002 | Parsons et al. | | 2003/0089308 A1 | 5/2003 | Raaijmakers |
| 2002/0045966 A1* | 4/2002 | Lee et al. ................. 700/121 | | 2003/0089942 A1 | 5/2003 | Bhattacharyya |
| 2002/0048635 A1 | 4/2002 | Kim et al. | | 2003/0096473 A1 | 5/2003 | Shih et al. |
| 2002/0052097 A1 | 5/2002 | Park | | 2003/0101927 A1 | 6/2003 | Raaijmakers |
| 2002/0060363 A1 | 5/2002 | Xi et al. | | 2003/0104710 A1 | 6/2003 | Visokay et al. |
| 2002/0064970 A1 | 5/2002 | Chooi et al. | | 2003/0106490 A1 | 6/2003 | Jallepally et al. |
| 2002/0068458 A1 | 6/2002 | Chiang et al. | | 2003/0108674 A1 | 6/2003 | Chung et al. |
| 2002/0073924 A1 | 6/2002 | Chiang et al. | | 2003/0109114 A1 | 6/2003 | Niwa |
| 2002/0074588 A1 | 6/2002 | Lee | | 2003/0113187 A1 | 6/2003 | Lei et al. |
| 2002/0076481 A1 | 6/2002 | Chiang et al. | | 2003/0116087 A1 | 6/2003 | Nguyen et al. |
| 2002/0076507 A1 | 6/2002 | Chiang et al. | | 2003/0116804 A1 | 6/2003 | Visokay et al. |
| 2002/0076508 A1 | 6/2002 | Chiang et al. | | 2003/0121608 A1 | 7/2003 | Chen et al. |
| 2002/0076837 A1 | 6/2002 | Hujanen et al. | | 2003/0124262 A1 | 7/2003 | Chen et al. |
| 2002/0081826 A1 | 6/2002 | Rotondaro et al. | | 2003/0129826 A1 | 7/2003 | Werkhoven et al. |
| 2002/0081844 A1 | 6/2002 | Jeon et al. | | 2003/0133861 A1 | 7/2003 | Bowen et al. |
| 2002/0086111 A1 | 7/2002 | Byun et al. | | 2003/0134508 A1 | 7/2003 | Raaijmakers et al. |
| 2002/0086507 A1 | 7/2002 | Park et al. | | 2003/0143328 A1 | 7/2003 | Chen et al. |
| 2002/0093046 A1 | 7/2002 | Moriya et al. | | 2003/0143839 A1 | 7/2003 | Raaijmakers et al. |
| 2002/0093781 A1 | 7/2002 | Bachhofer et al. | | 2003/0143841 A1 | 7/2003 | Yang et al. |
| 2002/0094689 A1 | 7/2002 | Park | | 2003/0153177 A1 | 8/2003 | Tepman et al. |
| 2002/0098627 A1 | 7/2002 | Pomarede et al. | | 2003/0160277 A1 | 8/2003 | Bhattacharyya |
| 2002/0102818 A1* | 8/2002 | Sandhu et al. ................. 438/479 | | 2003/0165615 A1 | 9/2003 | Aaltonen et al. |
| 2002/0104481 A1 | 8/2002 | Chiang et al. | | 2003/0168750 A1 | 9/2003 | Basceri et al. |
| 2002/0106536 A1 | 8/2002 | Lee et al. | | 2003/0173586 A1 | 9/2003 | Moriwaki et al. |
| 2002/0106846 A1 | 8/2002 | Seutter et al. | | 2003/0185980 A1 | 10/2003 | Endo |
| 2002/0115886 A1 | 8/2002 | Yasuhara et al. | | 2003/0186495 A1 | 10/2003 | Saanila et al. |
| 2002/0117399 A1 | 8/2002 | Chen et al. | | 2003/0188682 A1 | 10/2003 | Tois et al. |
| 2002/0135071 A1 | 9/2002 | Kang et al. | | 2003/0190423 A1 | 10/2003 | Yang et al. |
| 2002/0144655 A1 | 10/2002 | Chiang et al. | | 2003/0190497 A1 | 10/2003 | Yang et al. |
| 2002/0144657 A1 | 10/2002 | Chiang et al. | | 2003/0190804 A1 | 10/2003 | Glenn et al. |
| 2002/0146511 A1 | 10/2002 | Chiang et al. | | 2003/0194853 A1 | 10/2003 | Jeon |
| 2002/0146895 A1 | 10/2002 | Ramdani et al. | | 2003/0205729 A1 | 11/2003 | Basceri et al. |
| 2002/0151152 A1 | 10/2002 | Shimamoto et al. | | 2003/0213987 A1 | 11/2003 | Basceri et al. |
| 2002/0153579 A1 | 10/2002 | Yamamoto | | 2003/0219942 A1 | 11/2003 | Choi et al. |
| 2002/0155722 A1 | 10/2002 | Satta et al. | | 2003/0224578 A1 | 12/2003 | Chung et al. |
| 2002/0157611 A1* | 10/2002 | Bondestam et al. .......... 118/725 | | 2003/0224600 A1 | 12/2003 | Cao et al. |
| 2002/0162506 A1 | 11/2002 | Sneh et al. | | 2003/0227033 A1 | 12/2003 | Ahn et al. |
| 2002/0164421 A1 | 11/2002 | Chiang et al. | | 2003/0232497 A1 | 12/2003 | Xi et al. |
| 2002/0164423 A1 | 11/2002 | Chiang et al. | | 2003/0232501 A1 | 12/2003 | Kher et al. |
| 2002/0172768 A1 | 11/2002 | Endo et al. | | 2003/0232506 A1 | 12/2003 | Metzner et al. |
| 2002/0175393 A1 | 11/2002 | Baum et al. | | 2003/0232513 A1 | 12/2003 | Kraus et al. |
| 2002/0177282 A1 | 11/2002 | Song | | 2003/0234417 A1 | 12/2003 | Raaijmakers et al. |
| 2002/0180028 A1 | 12/2002 | Borovik et al. | | 2003/0235961 A1 | 12/2003 | Metzner et al. |
| 2002/0182320 A1 | 12/2002 | Leskela et al. | | 2004/0005749 A1 | 1/2004 | Choi et al. |
| 2002/0187256 A1 | 12/2002 | Elers et al. | | 2004/0007747 A1 | 1/2004 | Visokay et al. |
| 2002/0187631 A1 | 12/2002 | Kim et al. | | 2004/0009307 A1 | 1/2004 | Koh et al. |
| 2002/0192396 A1 | 12/2002 | Wang et al. | | 2004/0009336 A1 | 1/2004 | Marcadal et al. |
| 2002/0195643 A1 | 12/2002 | Harada | | 2004/0009675 A1 | 1/2004 | Eissa et al. |
| 2002/0197402 A1 | 12/2002 | Chiang et al. | | 2004/0011504 A1 | 1/2004 | Ku et al. |
| 2002/0197856 A1 | 12/2002 | Matsuse et al. | | 2004/0013577 A1 | 1/2004 | Ganguli et al. |
| 2002/0197863 A1 | 12/2002 | Mak et al. | | 2004/0013803 A1 | 1/2004 | Chung et al. |
| 2002/0197881 A1 | 12/2002 | Ramdani et al. | | 2004/0014320 A1 | 1/2004 | Chen et al. |
| 2003/0013300 A1 | 1/2003 | Byun | | 2004/0015300 A1 | 1/2004 | Ganguli et al. |
| 2003/0013320 A1 | 1/2003 | Kim et al. | | 2004/0016973 A1 | 1/2004 | Rotondaro et al. |
| 2003/0017697 A1 | 1/2003 | Choi et al. | | 2004/0018304 A1 | 1/2004 | Chung et al. |
| 2003/0022487 A1 | 1/2003 | Yoon et al. | | 2004/0018723 A1 | 1/2004 | Byun et al. |
| 2003/0022507 A1 | 1/2003 | Chen et al. | | 2004/0018747 A1 | 1/2004 | Lee et al. |
| 2003/0029715 A1 | 2/2003 | Yu et al. | | 2004/0023461 A1 | 2/2004 | Ahn et al. |
| 2003/0031807 A1 | 2/2003 | Elers et al. | | 2004/0023462 A1 | 2/2004 | Rotondaro et al. |
| 2003/0032281 A1 | 2/2003 | Werkhoven et al. | | 2004/0025370 A1 | 2/2004 | Guenther |
| 2003/0033979 A1* | 2/2003 | Kholodenko et al. ........ 118/715 | | 2004/0025787 A1* | 2/2004 | Selbrede et al. ............... 118/715 |
| 2003/0038369 A1 | 2/2003 | Layadi et al. | | 2004/0028952 A1 | 2/2004 | Cartier et al. |
| 2003/0042630 A1 | 3/2003 | Babcoke et al. | | 2004/0029321 A1 | 2/2004 | Ang et al. |
| 2003/0049931 A1 | 3/2003 | Byun et al. | | 2004/0033698 A1 | 2/2004 | Lee et al. |
| 2003/0049942 A1 | 3/2003 | Haukka et al. | | 2004/0036111 A1 | 2/2004 | Nishikawa et al. |
| 2003/0053799 A1 | 3/2003 | Lei | | 2004/0038486 A1 | 2/2004 | Chua et al. |
| 2003/0054631 A1 | 3/2003 | Raaijmakers et al. | | 2004/0038554 A1 | 2/2004 | Ahn et al. |
| 2003/0057526 A1 | 3/2003 | Chung et al. | | 2004/0040501 A1 | 3/2004 | Vaartstra |
| 2003/0057527 A1 | 3/2003 | Chung et al. | | 2004/0043149 A1 | 3/2004 | Gordon et al. |
| 2003/0059538 A1 | 3/2003 | Chung et al. | | 2004/0043569 A1 | 3/2004 | Ahn et al. |
| 2003/0068437 A1 | 4/2003 | Nakamura et al. | | 2004/0043623 A1 | 3/2004 | Liu et al. |

| | | | |
|---|---|---|---|
| 2004/0043630 A1 | 3/2004 | Vaartstra et al. | |
| 2004/0046197 A1 | 3/2004 | Basceri et al. | |
| 2004/0048461 A1 | 3/2004 | Chen et al. | |
| 2004/0048491 A1 | 3/2004 | Jung et al. | |
| 2004/0051152 A1 | 3/2004 | Nakajima | |
| 2004/0053484 A1 | 3/2004 | Kumar et al. | |
| 2004/0065255 A1 | 4/2004 | Yang et al. | |
| 2004/0067641 A1 | 4/2004 | Yudovsky | |
| 2004/0071897 A1 | 4/2004 | Verplancken et al. | |
| 2004/0077182 A1 | 4/2004 | Lim et al. | |
| 2004/0077183 A1 | 4/2004 | Chung | |
| 2004/0105934 A1 | 6/2004 | Chang et al. | |
| 2004/0144311 A1 | 7/2004 | Chen et al. | |
| 2004/0157391 A1 | 8/2004 | Park et al. | |
| 2004/0170403 A1 | 9/2004 | Lei | |
| 2004/0187304 A1 | 9/2004 | Chen et al. | |
| 2004/0197492 A1 | 10/2004 | Chen et al. | |
| 2004/0198069 A1 | 10/2004 | Metzner et al. | |
| 2004/0203254 A1 | 10/2004 | Conley et al. | |
| 2004/0209460 A1 | 10/2004 | Xi et al. | |
| 2004/0211665 A1 | 10/2004 | Yoon et al. | |
| 2004/0214354 A1 | 10/2004 | Marsh et al. | |
| 2004/0216670 A1 | 11/2004 | Gutsche et al. | |
| 2004/0219784 A1 | 11/2004 | Kang et al. | |
| 2004/0224506 A1 | 11/2004 | Choi et al. | |
| 2004/0235285 A1 | 11/2004 | Kang et al. | |
| 2004/0241321 A1 | 12/2004 | Ganguli et al. | |
| 2004/0256351 A1 | 12/2004 | Chung et al. | |
| 2004/0256664 A1 | 12/2004 | Chou et al. | |
| 2004/0266175 A1 | 12/2004 | Chen et al. | |
| 2005/0006799 A1 | 1/2005 | Gregg et al. | |
| 2005/0008779 A1 | 1/2005 | Yang et al. | |
| 2005/0009325 A1 | 1/2005 | Chung et al. | |
| 2005/0009371 A1 | 1/2005 | Metzner et al. | |
| 2005/0059240 A1 | 3/2005 | Choi et al. | |
| 2005/0064207 A1 | 3/2005 | Senzaki et al. | |
| 2005/0070126 A1 | 3/2005 | Senzaki | |
| 2005/0074968 A1 | 4/2005 | Chen et al. | |
| 2005/0104142 A1 | 5/2005 | Narayanan et al. | |
| 2005/0106865 A1 | 5/2005 | Chung et al. | |
| 2005/0118804 A1 | 6/2005 | Byun et al. | |
| 2005/0130438 A1 | 6/2005 | Rotondaro et al. | |
| 2005/0139948 A1 | 6/2005 | Chung et al. | |
| 2005/0153571 A1 | 7/2005 | Senzaki | |
| 2005/0164487 A1 | 7/2005 | Seutter et al. | |
| 2005/0173068 A1 | 8/2005 | Chen et al. | |
| 2005/0189072 A1 | 9/2005 | Chen et al. | |
| 2005/0208217 A1 | 9/2005 | Shinriki et al. | |
| 2005/0220998 A1 | 10/2005 | Chang et al. | |
| 2005/0233156 A1 | 10/2005 | Senzaki et al. | |
| 2005/0252449 A1 | 11/2005 | Nguyen et al. | |
| 2005/0255243 A1 | 11/2005 | Senzaki | |
| 2005/0255690 A1 | 11/2005 | Chen et al. | |
| 2005/0257735 A1 | 11/2005 | Guenther | |
| 2005/0260347 A1 | 11/2005 | Narwankar et al. | |
| 2005/0260357 A1 | 11/2005 | Olsen et al. | |
| 2005/0266682 A1 | 12/2005 | Chen et al. | |
| 2005/0271812 A1 | 12/2005 | Myo et al. | |
| 2005/0271813 A1 | 12/2005 | Kher et al. | |
| 2005/0277290 A1 | 12/2005 | Yang et al. | |
| 2006/0019033 A1 | 1/2006 | Muthukrishnan et al. | |
| 2006/0019494 A1 | 1/2006 | Cao et al. | |
| 2006/0019495 A1 | 1/2006 | Marcadal et al. | |
| 2006/0030148 A1 | 2/2006 | Seutter et al. | |
| 2006/0035025 A1 | 2/2006 | Verplancken et al. | |
| 2006/0040054 A1 | 2/2006 | Pearlstein et al. | |
| 2006/0057843 A1 | 3/2006 | Chen et al. | |
| 2006/0062917 A1 | 3/2006 | Muthukrishnan et al. | |
| 2006/0075966 A1 | 4/2006 | Chen et al. | |
| 2006/0128150 A1 | 6/2006 | Gandikota et al. | |
| 2006/0148253 A1 | 7/2006 | Chung et al. | |
| 2006/0153973 A1 | 7/2006 | Chang et al. | |
| 2006/0153995 A1 | 7/2006 | Narwankar et al. | |
| 2006/0156979 A1 | 7/2006 | Thakur et al. | |
| 2006/0199372 A1 | 9/2006 | Chung et al. | |
| 2006/0208215 A1 | 9/2006 | Metzner et al. | |
| 2006/0216928 A1 | 9/2006 | Chung et al. | |
| 2006/0223339 A1 | 10/2006 | Metzner et al. | |
| 2006/0257295 A1 | 11/2006 | Chen et al. | |
| 2006/0264067 A1 | 11/2006 | Kher et al. | |
| 2006/0276020 A1 | 12/2006 | Yoon et al. | |
| 2006/0292864 A1 | 12/2006 | Yang et al. | |
| 2007/0003698 A1 | 1/2007 | Chen et al. | |
| 2007/0018244 A1 | 1/2007 | Hung et al. | |
| 2007/0020890 A1 | 1/2007 | Thakur et al. | |
| 2007/0026147 A1 | 2/2007 | Chen et al. | |
| 2007/0036892 A1* | 2/2007 | Haukka et al. | 427/248.1 |
| 2007/0036894 A1* | 2/2007 | Thompson et al. | 427/248.1 |
| 2007/0049043 A1 | 3/2007 | Muthukrishnan et al. | |
| 2007/0049053 A1 | 3/2007 | Mahajani | |
| 2007/0059948 A1 | 3/2007 | Metzner et al. | |
| 2007/0065578 A1 | 3/2007 | McDougall | |
| 2007/0067609 A1 | 3/2007 | Chen et al. | |
| 2007/0099415 A1 | 5/2007 | Chen et al. | |
| 2007/0119370 A1 | 5/2007 | Ma et al. | |
| 2007/0119371 A1 | 5/2007 | Ma et al. | |
| 2007/0123060 A1* | 5/2007 | Rahtu | 438/783 |
| 2007/0128862 A1 | 6/2007 | Ma et al. | |
| 2007/0128863 A1 | 6/2007 | Ma et al. | |
| 2007/0128864 A1 | 6/2007 | Ma et al. | |
| 2008/0064210 A1 | 3/2008 | Vaartstra | |
| 2009/0032952 A1 | 2/2009 | Chen et al. | |

FOREIGN PATENT DOCUMENTS

| | | |
|---|---|---|
| EP | 0 973 191 | 1/2000 |
| EP | 1 146 141 | 10/2001 |
| EP | 1 167 569 | 1/2002 |
| EP | 1 170 804 | 1/2002 |
| EP | 1 321 973 | 6/2003 |
| GB | 2 355 727 | 5/2001 |
| JP | 02-246161 | 10/1990 |
| JP | 07-300649 | 11/1995 |
| JP | 10-308283 | 11/1998 |
| JP | 2000-031387 | 1/2000 |
| JP | 2000-058777 | 2/2000 |
| JP | 2001-111000 | 4/2001 |
| JP | 2001-172767 | 6/2001 |
| JP | 2001-220294 | 8/2001 |
| JP | 2001-254181 | 9/2001 |
| JP | 2002-060944 | 2/2002 |
| JP | 2002-069641 | 3/2002 |
| JP | 2002-093804 | 3/2002 |
| JP | 2002-167672 | 6/2002 |
| JP | 2002-172767 | 6/2002 |
| WO | WO-9617107 | 6/1996 |
| WO | WO-9901595 | 1/1999 |
| WO | WO-9929924 | 6/1999 |
| WO | WO-9965064 | 12/1999 |
| WO | WO-00-13235 | 3/2000 |
| WO | WO-0015865 | 3/2000 |
| WO | WO-0016377 | 3/2000 |
| WO | WO-0054320 | 9/2000 |
| WO | WO-0063957 | 10/2000 |
| WO | WO-0070674 | 11/2000 |
| WO | WO-0079576 | 12/2000 |
| WO | WO-0115220 | 3/2001 |
| WO | WO-0117692 | 3/2001 |
| WO | WO-0125502 | 4/2001 |
| WO | WO-0127346 | 4/2001 |
| WO | WO-0127347 | 4/2001 |
| WO | WO-0129280 | 4/2001 |
| WO | WO-0129891 | 4/2001 |
| WO | WO-0129893 | 4/2001 |
| WO | WO-0136702 | 5/2001 |
| WO | WO-0140541 | 6/2001 |
| WO | WO-0166832 | 9/2001 |
| WO | WO-0182390 | 11/2001 |
| WO | WO-0199166 | 12/2001 |
| WO | WO-0201628 | 1/2002 |
| WO | WO-0208485 | 1/2002 |
| WO | WO-0209167 | 1/2002 |
| WO | WO-0227063 | 4/2002 |
| WO | WO-0243115 | 5/2002 |
| WO | WO-0245167 | 6/2002 |
| WO | WO-0245871 | 6/2002 |
| WO | WO-0246489 | 6/2002 |

| WO | WO-02067319 | 8/2002 |
| WO | WO-2004010471 | 1/2004 |
| WO | WO-2004106584 | 12/2004 |

OTHER PUBLICATIONS

Balog, et al. "Chemical Vapor Deposition and Characterization of HfO$_2$ Films from Organo-Hafnium Compounds," Thin Solid Films, 41 (1977) 247-259.

Cameron, et al. "Atomic Layer Deposition of SiO$_2$ and TiO$_2$ in Alumina Tubular Membranes," Langmuir, vol. 16, No. 19, American Chemical Society, 2000, pp. 7435-7444.

Chatham, Hood; et al. "Nitridation of Hafnium Silicate Thin Films", Mat. Res. Soc. Symp. Proc. vol. 811, Apr. 12-16, 2004, D7.5.1.

Cheon, et al. "Gas Phase Photoproduction of Diatomic Metal Nitrides During Metal Nitride Laser Chemical Vapor Deposition," Inorg. Chem. 1999, 38, 2238-2239.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Conley, J.F.; et al. "Interval Annealing During Alternating Pulse Deposition", Mat. Res. Soc. Symp. Proc. vol. 811, Apr. 12-16, 2004, D1.3.1.

Dey, et al. "Ruthenium films by digital chemical vapor deposition: Selectivity, nanostructure, and work function," Applied Physics Letter, vol. 84, No. 9, Mar. 1, 2004, American Institute of Physics, pp. 1606.

Eisenbraun, et al. "Atomic Layer Deposition (ALD) of Tantalum-based materials for zero thickness copper barrier applications," Proceedings of the IEEE 2001 International Interconnect Technology Conference (Cat. No. 01EX461) 2001.

George, et al. "Surface Chemistry for Atomic Layer Growth," J. Phys. Chem. (1996), 100, 13121-13131.

Goswami, et al. Transition Metals Show Promise as Copper Barriers, Semiconductor International, ATMI, San Jose—May 1, 2004.

Goto, et al. "Atomic layer controlled deposition of silicon nitride with self-limiting mechanism," Applied Physics Letters, American Institute of Physics. New York, US, vol. 68, No. 23, Jun. 3, 1996, pp. 3257-3259.

He, et al. "Pulsed Deposition of Silicate Films," Journal of Applied Physics, vol. 94, No. 5, Sep. 1, 2003, pp. 3657-3659.

Hendrix, et al. "Composition control of Hf$_{1-x}$Si$_x$O$_2$ films deposited on Si by chemical-vapor deposition using amide precursors," Applied Physics Letters, American Institute of Physics. New York, US, vol. 80, No. 13, Apr. 1, 2002, pp. 2362-2364.

Ho, et al. "Suppressed crystallization of Hf-based gate dielectrics by controlled addition of Al$_2$O$_3$ using atomic layer deposition", Applied Physics Letters, American Institute of Physics, New York, US, vol. 81, No. 22, Nov. 25, 2002, pp. 4218-4220.

Hong, et al. "Characteristics of PAALD-TaN thin films derived from TAIMATA precursor for copper metallization", Internconnect Technology Conference, 2004. Proceedings of the IEEE 2004 International, Jun. 7-9, 2004, pp. 9-11.

Hwang, et al. "Nanometer-Size α-PbO$_2$-type TiO$_2$ in Garnet: A Thermobarometer for Ultrahigh-Pressure Metamorphism," Science Vo. 288 (Apr. 14, 2000).

Kamiyama, et al. "Improvement in the uniformity and the thermal stability of Hf-silicate gate dielectric by plasma-nitridation," Gate Insulator, 2003. IWGI 2003. Extended Abstracts of International Workshop on Nov. 6-7, 2003, Piscataway, NJ, USA, IEEE, Nov. 6, 2002, pp. 42-46.

Kang, et al. "Infrared Spectroscopic Study of Atomic Layer Deposition Mechanism for Hafnium Silicate Thin Films Using HfCl$_2$[N(SiMe$_3$)$_2$]$_2$ and H$_2$O," J. Vac. Sci. Technol. A 22(6), Nov./Dec. 2004, American Vacuum Society, pp. 2393-2397.

Kattelus, et al. "Electrical Properties of Tantalum Based Composite Oxide Films," Mat. Res. Soc. Symp. Proc., 284 (1993) 511-516.

Kawahara, et al. "Effects of Hf sources, oxidizing agents, and NH$_3$ radicals on properties of HfAlO$_x$ films prepared by atomic layer deposition", IWGI 2003, Tokyo, Nov. 6, 2003, pp. 32-37.

Klaus, et al. "Atomic Layer Deposition of SiO$_2$ Using Catalyzed and Uncatalyzed Self-Limiting Surface Reactions," Surface Review and Letters, vol. 6, Nos. 3 & 4 (1999), pp. 435-448.

Kukli, et al. "Atomic Layer Deposition of Hafnium Dioxide Films from Hafnium Tetrakis(ethylmethylamide) and Water", Chemical Vapor Deposition, VCH Publishers, Weinheim, DE, vol. 8, No. 5, Sep. 2002, pp. 199-204.

Kukli, et al. "Atomic Layer Epitaxy Growth of Tantalum Oxide Thin Films from Ta(OC$_2$H$_5$)$_5$ and H$_2$O," Journal of the Electrochemical Society, vol. 142, No. 5, May 1995; p. 1670-5.

Kukli, et al. "In situ Study of Atomic Layer Epitaxy Growth of Tantalum Oxide Thin Films From Ta(OC$_2$H$_5$)$_5$ and H$_2$O," Applied Surface Science, vol. 112, Mar. 1997, p. 236-42.

Kukli, et al. "Properties of {Nb$_{1-x}$Ta$_x$}$_2$O$_5$ Solid Solutions and {Nb$_{1-x}$Ta$_x$}$_2$O$_5$-ZrO$_2$ Nanolaminates Grown by Atomic Layer Epitaxy," 1997; p. 785-93.

Kukli, et al. "Properties of Ta$_2$O$_5$-Based Dielectric Nanolaminates Deposited by Atomic Layer Epitaxy," Journal of the Electrochemical Society, vol. 144, No. 1, Jan. 1997; p. 300-6.

Kukli, et al. "Tailoring the Dielectric Properties of HfO$_2$-Ta$_2$-O$_5$ Nanolaminates," Applied Physics Letters, vol. 68, No. 26, Jun. 24, 1996; p. 3737-9.

Martensson, et al. "Use of Atomic Layer Epitaxy for Fabrication of Si/TiN/Cu Structures," J. Vac. Sci. & Tech. B, vol. 17, No. 5, (Sep. 1999), pp. 2122-2128.

Min, et al. "Atomic Layer Deposition of TiN Thin Films by Sequential Introduction of Ti Precursor and NH$_3$," Mat. Res. Soc. Symp. Proc., vol. 514 (1998).

Min, et al. "Chemical Vapor Deposition of Ti-Si-N Films With Alternating Source Supply," Mat. Rec. Soc. Symp. Proc. (1999).

Min, et al. "Metal-organic Atomic-layer Deposition of Titanium-silicon-nitride films," Applied Physics Letters, vol. 75, No. 11 (Sep. 13, 1999).

Niinisto, et al. "Synthesis of Oxide Thin Films and Overlayers by Atomic Layer Epitaxy for Advanced Applications," Materials Science and Engineering B41 (1996), pp. 23-29.

Ohshita, et al. "Hf$_{1-x}$Si$_x$O$_2$ deposition by metal organic chemical vapor deposition using the Hf(NEt$_2$)$_4$/SiH(NEt$_2$)$_3$/O$_2$ gas system", Preparation and Characterization, Elsevier Sequioa, NL, vol. 416, No. 1-2, Sep. 2, 2002, pp. 208-211.

Ohshita, et al. "HfO$_2$ Growth by Low-pressure Chemical Vapor Deposition Using the Hf(N(C$_2$H$_5$)$_2$)$_4$/O$_2$ Gas System," Journal of Crystal Growth 233 (2001) 292-297.

Park, et al. "Performance improvement of MOSFET with HfO$_2$-Al$_2$O$_3$ laminate gate dielectric and CVD-TaN metal gate deposited by TAIMATA", Electron Devices Meeting, 2003. IEDM '03 Techinical Digest. IEEE International Dec. 8-10, 2003, pp. 13.6.1-13.6.4.

Proceedings of the ICEEE 1998 International Interconnect Technology Conference—San Francisco, California, Jun. 1-3, 1998.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Epitaxy Growth of TiN Thin Films From TiI$_4$ and NH$_3$," J. Electrochem. Soc., vol. 145, No. 8 (Aug. 1998), pp. 2914-2920.

Ritala, et al. "Atomic Layer Epitaxy Growth of TiN Thin Films," J. Electrochem. Soc., vol. 142, No. 8, Aug. 1995.

Ritala, et al. "Development of Crystallinity and Morphology in Hafnium Dioxide Thin Films Grown by Atomic Layer Epitaxy," Thin Solid Films, vol. 250, No. 1-2, (Oct. 1, 1994), p. 72-80.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, et al. "Growth of Titanium Dioxide Thin Films by Atomic Layer Epitaxy," Thin Solid Films, vol. 225, No. 1-2 (Mar. 25, 1993) pp. 288-295.

Ritala, et al. "Perfectly Conformal TiN and Al$_2$O$_3$ Films Deposited by Atomic Layer Deposition," Chemical Vapor Deposition, Jan. 1999, 5, No. 1, pp. 6-9.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

Ritala, et al. Ann. Acad. Sci. Fenn. Ser. A II. Chemica 257 (1994) 1-48.

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Sekine, et al. "Nitrogen profile control by plasma nitridation technique for poly-Si gate HfSiON CMOSFET with excellent interface property and ultra-low leakage current," International Electron Devices Meeting 2003. IEDM. Technical Digest. Washington, DC, Dec. 8-10, 2003, New York, NY, IEEE, US, Dec. 8, 2003, pp. 103-106.

Senzaki, et al. "A Novel Atomic Layer Deposition Process to Deposit Hafnium Silicate Thin Films", Electrochemical Society Proceedings vol. 2004-01, pp. 264-270.

Shenai, et al. "Correlation of vapor pressure equation and film properties with trimethylindium purity for the MOVPE grown III-V compounds," Journal of Crystal Growth 248 (2003) pp. 91-98.

"Ta($N_tC_5H_{11}$)[$N(CH_3)_2$] Taimata®," http://c1005059.securesites.net/topic/Taimata/Taimata-E.htm, Jun. 13, 2007, pp. 1-3.

Visokay, et al. "Application of HfSiON as a gate dielectric material", Applied Physics Letter, American Institute of Physics, New York, US, vol. 80, No. 17, Apr. 29, 2002, pp. 3183-3185.

International Search Report and Written Opinion of the International Searching Authority mailed Mar. 25, 2010 in PCT/US2009/054321.

International Search Report and Written Opinion dated Nov. 30, 2010 for International Application No. PCT/US2010/031491.

* cited by examiner

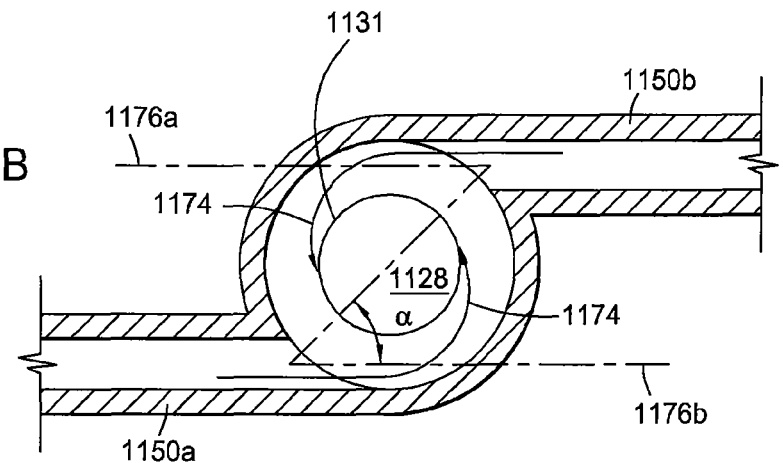
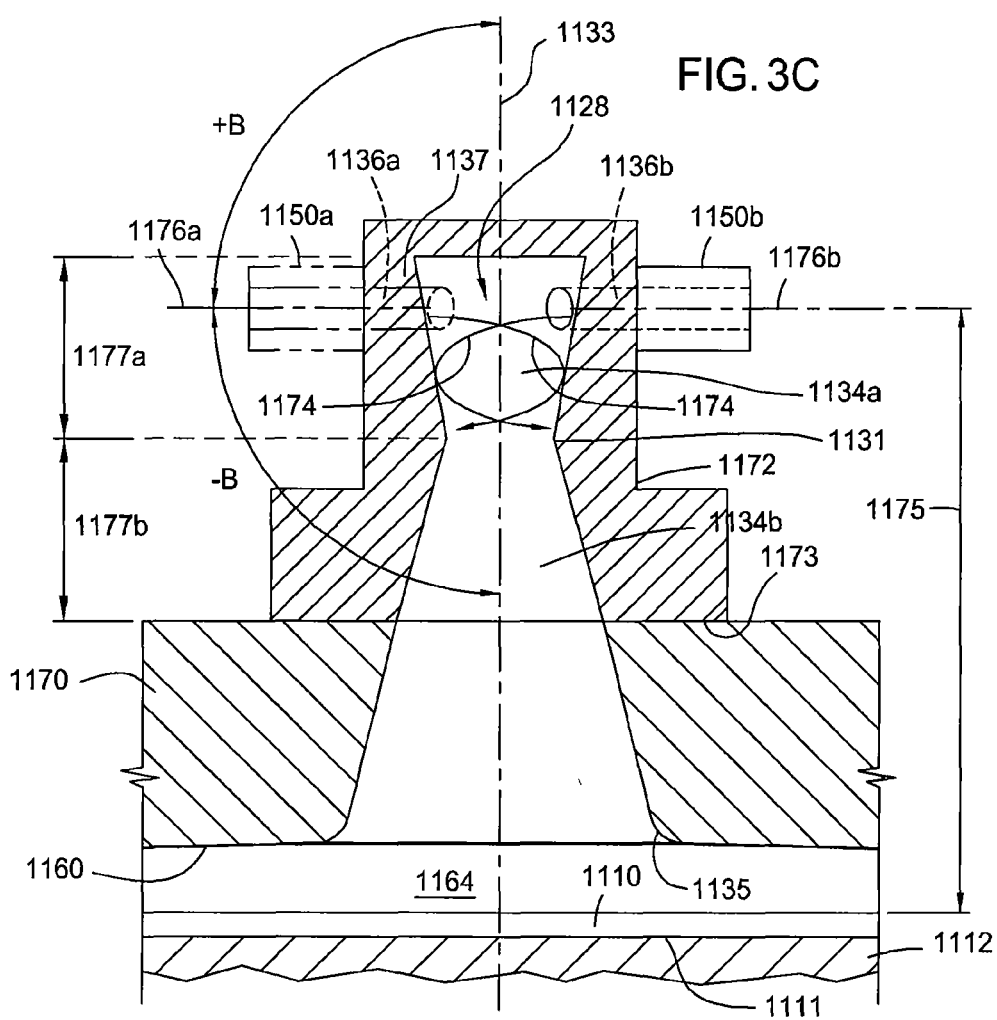

IN-SITU CHAMBER TREATMENT AND DEPOSITION PROCESS

BACKGROUND OF THE INVENTION

1. Field of the Invention

Embodiments of the invention generally relate to semiconductor and other electronic device processing, and more particularly, to an improved method for treating the surfaces of a processing chamber and a substrate therein prior to a vapor deposition process.

2. Description of the Related Art

The electronic device industry and the semiconductor industry continue to strive for larger production yields while increasing the uniformity of layers deposited on substrates having increasingly larger surface areas. These same factors in combination with new materials also provide higher integration of circuits per unit area on the substrate. The need for greater uniformity, deposition rate, and process control regarding layer characteristics rises as the desire for an increased circuit integration. Formation of tantalum-containing layers, such as tantalum, tantalum nitride, and tantalum silicon nitride, in multi-level integrated circuits poses many challenges to process control, particularly with respect to contact formation.

Barrier layers formed from sputtered tantalum and reactive sputtered tantalum nitride have demonstrated properties suitable for use to control copper diffusion. Exemplary properties include high conductivity, high thermal stability and resistance to diffusion of foreign atoms. Both physical vapor deposition (PVD) and atomic layer deposition (ALD) processes are used to deposit tantalum or tantalum nitride in features of small size (e.g., about 90 nm wide) and high aspect ratios of about 5:1. However, it is believed that PVD processes may have reached a limit at this size and aspect ratio, while ALD processes suffer other problems.

Common problems encountered during ALD processes include the lack of stability for the deposition rate and the non-uniformity performance after multiple runs are completed within the same ALD processing chamber. The aging of the the processing chamber, including the process kit within, is a function of the deposition frequencey and the type of deposited film on the inner surfaces of the processing chamber. The deposited film on the inner surfaces of the processing chamber significantly affects the deposition characteristics of ALD processes due to introduction of secondary reactions. The secondary reactions result in a drift of the deposition rate and the non-uniformity performance with increasing number of substrates processed within the ALD chamber. Also, deposited films on the inner surfaces of the processing chamber may peel to form particulates, which end up contaminating the substrate surface.

Therefore, there is a need for increasing the stability of the deposition rate and the uniformity of deposited materials on a substrate during a vapor deposition process, as well as a need to reduce or elimante contaminants within the processing chamber.

SUMMARY OF THE INVENTION

In one embodiment, a method for treating a chamber and depositing a material on a substrate surface is provided which includes exposing inner surfaces of a processing chamber and a substrate disposed within the processing chamber to a treatment gas containing a hydrogenated ligand compound during a pretreatment process, and subsequently, exposing the substrate to a first precursor gas to deposit a material on the substrate during a vapor deposition process. The substrate may be sequentially or simultaneously exposed to the first precursor and at least a second precursor gas during the vapor deposition process, such as an atomic layer deposition (ALD) process or a chemical vapor deposition (CVD) process.

In many examples, the hydrogenated ligand compound within the treatment gas has the chemical formula of HL, where L is a ligand such as alkylamino, alkylimino, alkoxy, alkyl, alkene, alkyne, cyclopentadienyl, alkylcyclopentadienyl, pentadienyl, pyrrolyl, or derivatives thereof. The first precursor gas may contain a first precursor having the chemical formula of $ML'_x$, where x is 1, 2, 3, 4, 5, 6, or greater, M is an element such as Ti, Zr, Hf, Nb, Ta, Mo, W, Ru, Co, Ni, Pd, Pt, Cu, Al, Ga, In, Si, Ge, Sn, P, As, or Sb, and each L' is independently a ligand such as alkylamino, alkylimino, alkoxy, alkyl, alkene, alkyne, cyclopentadienyl, alkylcyclopentadienyl, pentadienyl, pyrrolyl, hydrogen, halogen, derivatives thereof, or combinations thereof.

In some embodiments, the method provides that the vapor deposition process is an ALD process and the substrate is sequentially exposed to the alkylamino metal precursor gas and the second precursor gas during the ALD process. In other embodiments, the vapor deposition process is a CVD process and the substrate is simultaneously exposed to the alkylamino metal precursor gas and the second precursor gas during the CVD process. In one example, a method for treating a chamber and depositing a material on a substrate surface is provided which includes exposing inner surfaces of a processing chamber and a substrate within the processing chamber to a treatment gas containing an alkylamine compound during a pretreatment process, and exposing the substrate sequentially to an alkylamino metal precursor gas and at least a second precursor gas while depositing a material on the substrate during an ALD process. In one example, the second precursor gas contains a nitrogen precursor, such as ammonia, which is used to deposit a metal nitride material, such as tantalum nitride.

In some examples, the treatment gas contains a hydrogenated ligand compound, such as an alkylamine compound having the chemical formula of $H_2NR$ or $HNR'R''$, where each R, R', and R'' is independently methyl, ethyl, propyl, butyl, amyl, phenyl, aryl, isomers thereof, derivatives thereof, or combinations thereof. The alkylamine compound may be methylamine, dimethylamine, ethylamine, diethylamine, methylethylamine, propylamine, dipropylamine, butylamine, dibutylamine, isomers thereof, derivatives thereof, or combinations thereof. The treatment gas may further contain at least one carrier gas such as ammonia, hydrogen, nitrogen, argon, helium, or combinations thereof. In one example the treatment gas contains dimethylamine, ammonia, and another carrier gas, such as argon.

In some embodiments, the alkylamino metal precursor gas contains an alkylamino metal precursor having the chemical formula of $ML'_x$, where x is 1, 2, 3, 4, 5, 6, or greater, M may be a metal or other element such as Ti, Zr, Hf, Ta, Mo, W, or Si, and each ligand L' is independently a ligand, such as an alkylamino ligand, which include $N(CH_3)_2$, $N(C_2H_5)_2$, $N(C_3H_7)_2$, $N(C_4H_9)_2$, $N(CH_3)(C_2H_5)$, isomers thereof, derivatives thereof, or combinations thereof. In some examples, the metal or element M may be Si, Ti, Zr, or Hf while x is usually 4. In other examples, the alkylamino metal precursor is a tantalum precursor with the metal M being Ta while x is usually 4 or 5. Examples of tantalum precursors include pentakis(dimethylamino) tantalum (PDMAT), pentakis(diethylamino) tantalum, pentakis(ethylmethylamino) tantalum, tert-butylimino tris(dimethylamino) tantalum, tert-butylimino tris(diethylamino) tantalum, tert-butylimino tris (ethylmethylamino) tantalum, tert-amylimino-tris(dimethylamino) tantalum, tert-amylimino-tris(diethylamino) tantalum, tert-amylimino-tris(ethylmethylamino) tantalum, or derivatives thereof. In one example, the tantalum precursor is PDMAT and the alkylamine compound gas contains methylamine or dimethylamine.

In other examples, the hydrogenated ligand compound within the treatment gas may be an alcohol compound having the chemical formula of ROH, where R is methyl, ethyl, propyl, butyl, amyl, isomers thereof, or derivatives thereof. The alcohol compound may be methanol, ethanol, propanol, butanol, pentanol, isomers thereof, derivatives thereof, or combinations thereof. In examples that the hydrogenated ligand compound is an alcohol, the first precursor may contain an alkoxy ligand such as $OCH_3$, $OC_2H_5$, $OC_3H_7$, $OC_4H_9$, isomers thereof, or derivatives thereof. In other examples, the ligand L of the hydrogenated ligand compound may be cyclopentadienyl, alkylcyclopentadienyl, pentadienyl, pyrrolyl, isomers thereof, or derivatives thereof and the ligand L' of the first precursor may be cyclopentadienyl, alkylcyclopentadienyl, pentadienyl, pyrrolyl, isomers thereof, or derivatives thereof.

The processing chamber generally contains a lid assembly and a chamber body, which may be independently heated to a temperature within a range from about 30° C. to about 100° C., preferably, from about 40° C. to about 80° C., during the pretreatment process. The inner surfaces of the lid assembly and the chamber body may be exposed to the alkylamine compound gas during the pretreatment process. The pretreatment process may last for a time period within a range from about 5 seconds to about 60 seconds, preferably, from about 15 seconds to about 40 seconds, and more preferably, from about 10 seconds to about 30 seconds.

The treatment of the interior surfaces of the processing chamber during the pretreatment process helps to increase the uniformity (or decrease the non-uniformity) across the substrate surface of the deposited materials—as opposed to not conducting the pretreatment process. The non-uniformity of the deposited material across the substrate surface may be about 12% or less, preferably, about 10% or less, and more preferably, about 8% or less, for example, about 6% or less.

In one example, a method for treating a chamber and depositing a material on a substrate surface is provided which includes exposing the inner surfaces of a processing chamber and a substrate disposed within the processing chamber to a carrier gas having a continuous flow, introducing a treatment gas containing methylamine or dimethylamine to the continuously flowing carrier gas to expose the inner surfaces of the processing chamber and the substrate to the treatment gas during a pretreatment process. The method further provides alternately or sequentially pulsing a tantalum precursor gas and a nitrogen precursor gas into the continuously flowing carrier gas to sequentially expose the substrate to the tantalum and nitrogen precursor gases while depositing a tantalum nitride material on the substrate during an ALD process. In one example, the tantalum precursor gas contains PDMAT and the nitrogen precursor gas contains ammonia.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

FIGS. 3A-3C depict a schematic cross-sectional view of a processing chamber including a lid assembly and a gas delivery apparatus adapted for ALD as described in another embodiment herein.

DETAILED DESCRIPTION

Figure 1:
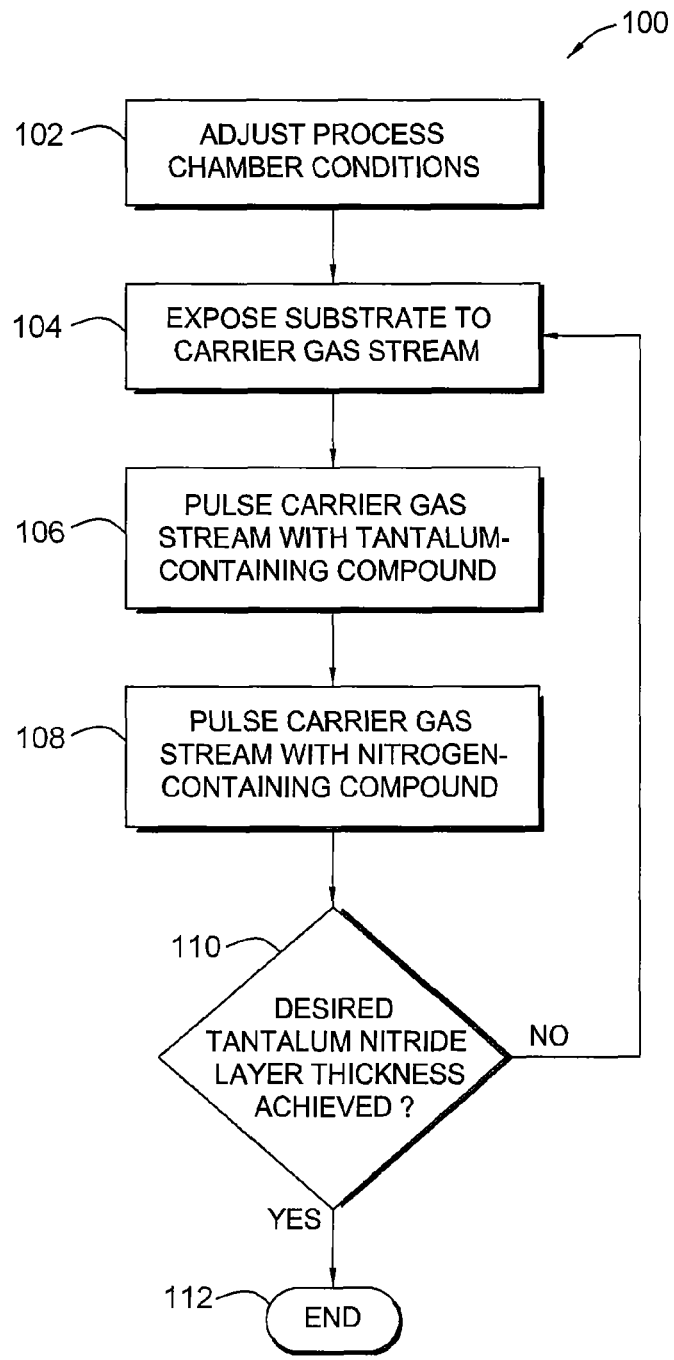
FIG. 1 depicts a flow diagram showing a method for depositing a tantalum nitride material in accordance with one embodiment described herein.

Embodiments of the invention provide a method for treating the inner surfaces of a processing chamber in situ and depositing a material on a substrate within the processing chamber during a vapor deposition process. The substrate may be sequentially or simultaneously exposed to a first precursor and a second precursor gas during the vapor deposition process, such as atomic layer deposition (ALD) or by chemical vapor deposition (CVD). In one embodiment, the inner surfaces of the processing chamber and the substrate may be exposed to a treatment gas containing a reagent, such as a hydrogenated ligand compound during a pretreatment process. The hydrogenated ligand compound may be the same ligand as a free ligand formed from the metal-organic precursor used during the subsequent vapor deposition process. The free ligand is usually formed by hydrogenation or thermolysis during the deposition process. In one example, the processing chamber and substrate are exposed to an alkylamine compound (e.g., dimethylamine) during a pretreatment process prior to conducting the vapor deposition process which utilizes a metal-organic chemical precursor which may have alkylamino ligands, such as pentakis(dimethylamino) tantalum (PDMAT, $((CH_3)_2N)_5Ta$).

In many examples, the treatment gas contains a hydrogenated ligand compound having the chemical formula of HL, where L is a ligand such as alkylamino, alkylimino, alkoxy, alkyl, alkene, alkyne, cyclopentadienyl, alkylcyclopentadienyl, pentadienyl, pyrrolyl, or derivatives thereof. The chemical precursor gas contains a chemical precursor having the chemical formula of $ML'_x$, where x is 1, 2, 3, 4, 5, 6, or greater, M is an element such as Ti, Zr, Hf, Nb, Ta, Mo, W, Ru, Co, Ni, Pd, Pt, Cu, Al, Ga, In, Si, Ge, Sn, P, As, or Sb, and each L' is independently a ligand such as alkylamino, alkylimino, alkoxy, alkyl, alkene, alkyne, cyclopentadienyl, alkylcyclopentadienyl, pentadienyl, pyrrolyl, hydrogen, halogen, derivatives thereof, or combinations thereof.

In some embodiments, the method provides that the vapor deposition process is an ALD process and the substrate is sequentially exposed to the alkylamino metal precursor gas and another chemical precursor gas during the ALD process. In other embodiments, the vapor deposition process is a CVD process and the substrate is simultaneously exposed to the alkylamino metal precursor gas and another chemical precursor gas during the CVD process. In one example, the method provides exposing inner surfaces of a processing chamber and a substrate within the processing chamber to a treatment gas containing an alkylamine compound during a pretreatment process, and exposing the substrate sequentially to an alkylamino metal precursor gas and at least one additional chemical precursor gas while depositing a material on the substrate during an ALD process. In one example, the additional chemical precursor gas contains a nitrogen precursor, such as ammonia, which is used to deposit a metal nitride material, such as tantalum nitride.

In some examples, the treatment gas contains an alkylamine compound having the chemical formula of $H_2NR$ or $HNR'R''$, where each R, R', and R'' is independently methyl, ethyl, propyl, butyl, amyl, phenyl, aryl, isomers thereof, derivatives thereof, or combinations thereof. The alkylamine compound may be methylamine, dimethylamine, ethylamine, diethylamine, methylethylamine, propylamine, dipropylamine, butylamine, dibutylamine, isomers thereof, derivatives thereof, or combinations thereof. The treatment gas may further contain at least one carrier gas such as ammonia, hydrogen, nitrogen, argon, helium, or combinations thereof. In one example the treatment gas contains dimethylamine, ammonia, and another carrier gas, such as argon.

In some embodiments, the alkylamino metal precursor gas contains an alkylamino metal precursor having the chemical formula of $ML'_x$, where x is 1, 2, 3, 4, 5, 6, or greater, M may be a metal or other element such as Ti, Zr, Hf, Ta, Mo, W, or Si, and each ligand L' is independently a ligand, such as an alkylamino ligand, which include $N(CH_3)_2$, $N(C_2H_5)_2$, $N(C_3H_7)_2$, $N(C_4H_9)_2$, $N(CH_3)(C_2H_5)$, isomers thereof, derivatives thereof, or combinations thereof. In some examples, the metal or the element M may be Si, Ti, Zr, or Hf while x is usually 4. In other examples, the alkylamino metal precursor is a tantalum precursor with the metal M being Ta while x is usually 4 or 5. Examples of tantalum precursors include pentakis(dimethylamino) tantalum, pentakis(diethylamino) tantalum, pentakis(ethylmethylamino) tantalum, tert-butylimino tris(dimethylamino) tantalum, tert-butylimino tris(diethylamino) tantalum, tert-butylimino tris(ethylmethylamino) tantalum, tert-amylimino-tris(dimethylamino) tantalum, tert-amylimino-tris(diethylamino) tantalum, tert-amylimino-tris(ethylmethylamino) tantalum, or derivatives thereof. In one example, the tantalum precursor is PDMAT and the alkylamine compound gas contains methylamine or dimethylamine.

In other examples, the hydrogenated ligand compound within the treatment gas may be an alcohol compound having the chemical formula of ROH, where R is methyl, ethyl, propyl, butyl, amyl, isomers thereof, or derivatives thereof. The alcohol compound may be methanol, ethanol, propanol, butanol, pentanol, isomers thereof, derivatives thereof, or combinations thereof. In examples that the hydrogenated ligand compound is an alcohol, the chemical precursor may contain an alkoxy ligand such as $OCH_3$, $OC_2H_5$, $OC_3H_7$, $OC_4H_9$, isomers thereof, or derivatives thereof. In other examples, the ligand L of the hydrogenated ligand compound may be cyclopentadienyl, alkylcyclopentadienyl, pentadienyl, pyrrolyl, isomers thereof, or derivatives thereof and the ligand L' of the chemical precursor may be cyclopentadienyl, alkylcyclopentadienyl, pentadienyl, pyrrolyl, isomers thereof, or derivatives thereof.

The processing chamber generally contains a lid assembly and a chamber body, which may be independently heated to a temperature within a range from about 30° C. to about 100° C., preferably, from about 40° C. to about 80° C., during the pretreatment process. The inner surfaces of the lid assembly and the chamber body may be exposed to the alkylamine compound gas during the pretreatment process. The pretreatment process may last for a time period within a range from about 5 seconds to about 60 seconds, preferably, from about 15 seconds to about 40 seconds, and more preferably, from about 10 seconds to about 30 seconds.

In one example, a method for treating a chamber and depositing a material on a substrate surface is provided which includes exposing the inner surfaces of a processing chamber and a substrate disposed within the processing chamber to a carrier gas having a continuous flow, introducing a treatment gas containing methylamine or dimethylamine to the continuously flowing carrier gas to expose the inner surfaces of the processing chamber and the substrate to the treatment gas during a pretreatment process. The method further provides alternately or sequentially pulsing a tantalum precursor gas and a nitrogen precursor gas into the continuously flowing carrier gas to sequentially expose the substrate to the tantalum and nitrogen precursor gases while depositing a tantalum nitride material on the substrate during an ALD process. In one example, the tantalum precursor gas contains PDMAT and the nitrogen precursor gas contains ammonia.

FIG. 1 depicts a flowchart of sequences for ALD process 100 for depositing a tantalum nitride material in accordance with one embodiment described herein. ALD process 100 provides a constant flow of a carrier gas administered into the processing chamber and exposed to a substrate therein. At step 102, the processing chamber may be heated and pressurized to a predetermined temperature and pressure. Also, the processing chamber and/or substrate may be exposed to a pretreatment process during step 102. The pretreatment process provides exposing the inner surfaces of the processing chamber and the substrate to a treatment gas containing a hydrogenated ligand compound, preferably, an alkylamine compound, such as methylamine, dimethylamine, or derivatives thereof.

The treatment gas containing the hydrogenated ligand compound may be exposed to the inner surfaces of the processing chamber or the substrate with or without a carrier gas. In many examples, the treatment gas contains at least one carrier gas as well as the hydrogenated ligand compound. The carrier gas of the treatment gas may be ammonia, argon, nitrogen, hydrogen, helium, or mixtures thereof. In an alternative embodiment, such as for forming oxides or other materials, the carrier gas of the treatment gas may include oxygen, nitrous oxide, or air.

The processing chamber and the substrate may be exposed to the treatment gas having a gas flow rate within a range from about 0.5 slm to about 20 slm, preferably, from about 1 slm to about 16 slm, and more preferably, from about 2 slm to about 8 slm, such as about 4 slm during step 102. The treatment gas may be formed by flowing the carrier gas through an ampoule or a bubbler containing the hydrogenated ligand compound. Alternatively, the treatment gas may be formed by co-flowing the hydrogenated ligand compound with the carrier gas. The hydrogenated ligand compound may have a gas flow rate within a range from about 5 sccm to about 1,000 sccm, preferably, from about 25 sccm to about 500 sccm, and more preferably, from about 50 sccm to about 150 sccm, such as about 100 sccm. In one example, the treatment gas contains an alkylamine compound, such as methylamine, dimethylamine, or derivatives thereof, as well as at least one carrier gas. In one example, the treatment gas may contain dimethylamine with a flow rate of about 100 sccm and argon with a flow rate of about 4 slm. In another example, the treatment gas may contain dimethylamine with a flow rate of about 20 sccm, ammonia with a flow rate of about 1 slm, and argon with a flow rate of about 8 slm. The processing chamber and/or substrate may be exposed to the treatment gas containing the hydrogenated ligand or other reagent for a time period within a range from about 2 seconds to about 120 seconds, preferably, from about 5 seconds to about 60 seconds, for example, about 20 seconds or about 40 seconds.

During the pretreatment process and the deposition process, the processing chamber and the substrate may be maintained approximately below a thermal decomposition temperature of the selected chemical precursor, such as PDMAT. An exemplary temperature of the processing chamber, the substrate, and/or the substrate pedestal during the pretreatment process and the deposition process may be within a range from about 100° C. to about 500° C., preferably, from about 200° C. to about 400° C., and more preferably, from about 250° C. to about 300° C. The processing chamber may contain a chamber body and a chamber lid, which each may independently be heated to a temperature within a range from about 25° C. to about 300° C., preferably, from about 30° C. to about 100° C., and more preferably, from about 40° C. to about 80° C. The processing chamber may have an internal pressure within a range from about 1 mTorr to about 100 Torr, preferably, from about 1 Torr to about 50 Torr, and more preferably, from about 5 Torr to about 20 Torr, such as about 10 Torr.

The tantalum nitride layer formation is described as starting a stream of carrier gas into the processing chamber and across the substrate in step 104. In step 106, a pulse of tantalum precursor is administered into the processing chamber. The tantalum precursor is pulsed into the stream of carrier gas. A monolayer of a tantalum precursor is adsorbed on the substrate. The remaining tantalum precursor may be removed by the flow of the purge gas and/or pull of a vacuum system. The carrier gas is continuously exposed to the substrate and a pulse of nitrogen precursor is added into the carrier gas during step 108. The nitrogen precursor, such as ammonia, reacts with the adsorbed tantalum precursor to form a tantalum nitride layer on the substrate. The remaining nitrogen precursor and any by-products (e.g., organic compounds) may be removed by the flow of the purge gas and/or pull of a vacuum system. At step 110, if the desired tantalum nitride layer thickness is achieved, then the deposition process is ended at step 112. However, multiple cycles of steps 104-110 are generally repeated before achieving the desired tantalum nitride layer thickness. In one example, PDMAT and ammonia are sequentially pulsed for 40 cycles to deposit a film with a thickness about 20 Å.

Alternatively for process 100, the tantalum nitride layer formation may start with the adsorption of a monolayer of a nitrogen precursor on the substrate followed by a monolayer of the tantalum precursor. Furthermore, in other example, a pump evacuation alone between pulses of reactant gases and/or purge gases may be used to prevent mixing of the reactant gases.

The PDMAT precursor may be heated within an ampoule, a vaporizer, a bubbler, or a similar container prior to flowing into an ALD processing chamber. The PDMAT may be heated to a temperature at least 30° C., preferably within a range from about 45° C. to about 90° C., more preferably from about 50° C. to about 80° C., such as about 73° C. The preheated PDMAT precursor is retained in the carrier gas more thoroughly than if the PDMAT precursor was at room temperature (about 20° C.). In order to heat the PDMAT precursor to a desired temperature, the ampoule, delivery lines, and valves on the ampoule and/or delivery lines may each be independently heated to a temperature within a range from about 25° C. to about 300° C., preferably, from about 50° C. to about 150° C., and more preferably, from about 70° C. to about 120° C. In one example, the sidewalls of the ampoule may be heated to about 85° C., the delivery lines may be heated to about 100° C., and the valves may be heated to about 95° C.

For clarity and ease of description, the method will be further described as it relates to the deposition of a tantalum nitride barrier layer using an ALD process. Pulses of a tantalum precursor or a tantalum-containing compound, such as PDMAT may be introduced into the processing chamber. The tantalum precursor may be provided with the aid of a carrier gas or purge gas, which includes, but is not limited to, helium, argon, nitrogen, hydrogen, forming gas, or mixtures thereof. Pulses of a nitrogen precursor or a nitrogen-containing compound, such as ammonia, are also introduced into the processing chamber. A carrier gas may be used to deliver the nitrogen precursor. In one aspect, the flow of purge gas may be continuously provided by a gas sources (e.g., tank or in-house) to act as a purge gas between the pulses of the tantalum precursor and of the nitrogen precursor and to act as a carrier gas during the pulses of the tantalum precursor and the nitrogen precursor. In other aspects, a pulse of purge gas may be provided after each pulse of the tantalum precursor and each pulse the nitrogen precursor. Also, a constant purge or carrier gas may be flowing through the processing chamber during each of the deposition steps or half reactions.

In one example, the substrate may be heated to a temperature within a range from about 250° C. to about 300° C. and the internal pressure of the chamber may be within a range from about 5 Torr to about 15 Torr. The substrate may be exposed to an argon carrier gas having a flow rate within a range from about 1,000 sccm to about 3,000 sccm, preferably about 1,500 sccm. A tantalum precursor gas is formed by flowing the argon carrier gas through the ampoule of preheated PDMAT a rate from about 200 sccm to about 2,000 sccm, preferably about 500 sccm. The PDMAT is maintained at about 73° C. A process gas containing PDMAT is administered to the substrate surface for a period of time within a range from about 0.1 seconds to about 3.0 seconds, preferably, from about 0.5 seconds to about 1.5 seconds, for example, about 1 second.

After the substrate is exposed to a pulse of PDMAT, the flow of argon carrier gas may continue to purge for a period of time within a range from about 0.2 seconds to about 5.0 seconds, preferably, from about 0.25 seconds to about 1.5 seconds, for example, about 0.5 seconds. A vacuum system removes any remaining PDMAT during this purge step. Subsequently, a pulse of a nitrogen-containing process gas containing ammonia is administered to the substrate surface. The process gas may include the nitrogen precursor in a carrier gas or may be solely the nitrogen precursor. In one example, the process gas contains ammonia and nitrogen. The process gas containing ammonia is delivered a rate from about 1,000 sccm to about 3,000 sccm, preferably about 1,500 sccm and is administered to the substrate surface for a period of time within a range from about 0.1 seconds to about 3.0 seconds, preferably, from about 0.5 seconds to about 1.5 seconds, fro example about 1 second. After the pulse of the process gas containing ammonia, the flow of the argon carrier gas may continue for a period of time within a range from about 0.2 seconds to about 5.0 seconds, preferably, from about 0.25 seconds to about 1.5 seconds, for example, about 0.5 seconds. The vacuum system removes any remaining nitrogen precursor and/or any by-products formed during the reaction.

The ALD cycle is repeated until a predetermined thickness of the deposited material, such as tantalum nitride, is achieved, such as within a range from about 5 Å to about 200 Å, preferably, from about 10 Å to about 30 Å, such as about 20 Å for a barrier layer. The treatment of the interior surfaces of the processing chamber during the pretreatment process helps to increase the uniformity (or decrease the non-uniformity) across the substrate surface of the deposited materials—as opposed to not conducting the pretreatment process. The non-uniformity of the deposited material across the substrate surface may be about 12% or less, preferably, about 10% or less, and more preferably, about 8% or less, for example, about 6% or less.

Figure 2:
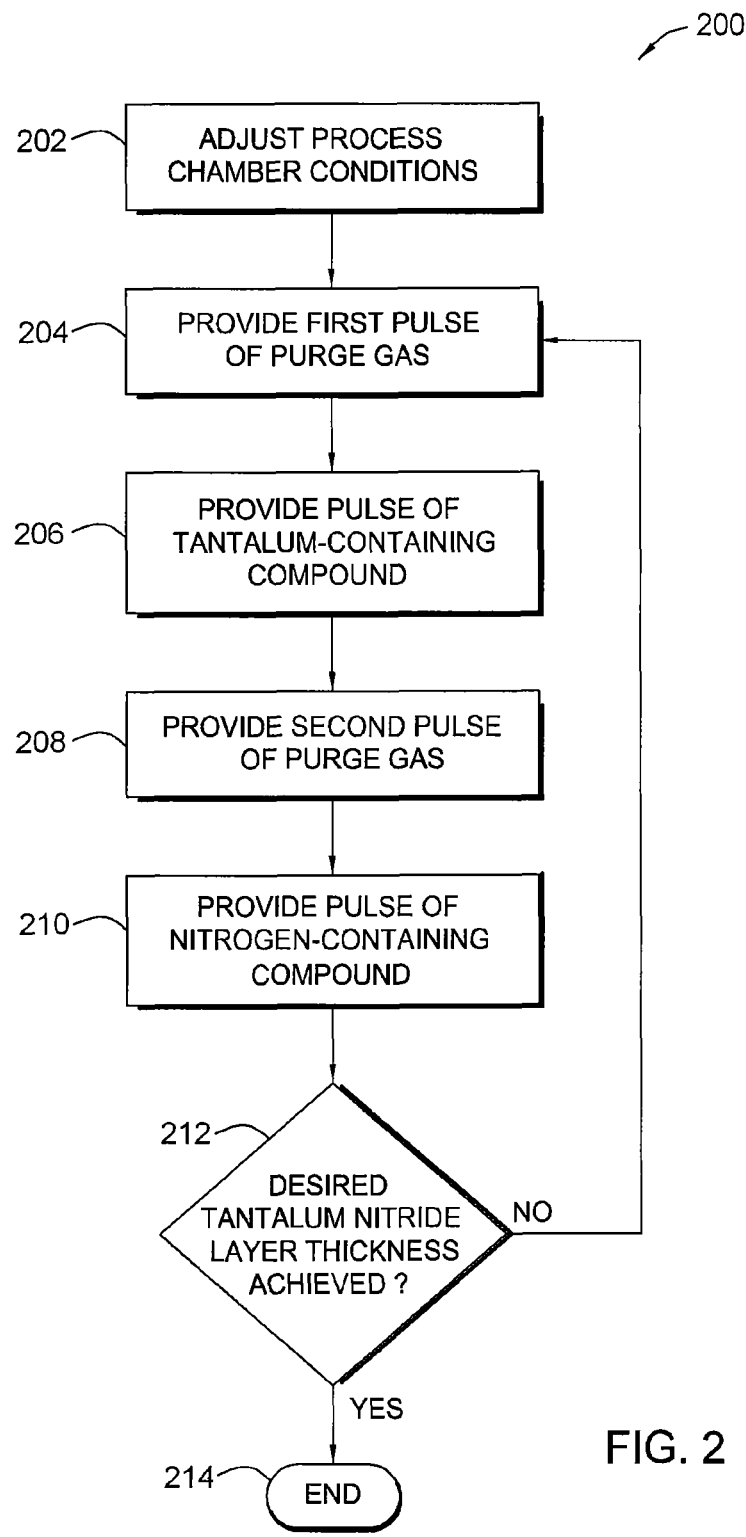
FIG. 2 depicts a flow diagram showing a method for depositing a tantalum nitride material in accordance with another embodiment described herein.

FIG. 2 depicts a flowchart of sequences for ALD process 200 for depositing a tantalum nitride material in accordance with one embodiment described herein. ALD process 200 provides a constant flow of a carrier gas administered into the processing chamber and exposed to a substrate therein. At step 202, the processing chamber may be heated and pressurized to a predetermined temperature and pressure. The processing chamber and/or substrate may be exposed to a pretreatment process during step 202. The pretreatment process provides exposing the inner surfaces of the processing chamber and the substrate to a treatment gas containing a hydrogenated ligand compound, preferably, an alkylamine compound, such as methylamine, dimethylamine, or derivatives thereof.

The treatment gas containing the hydrogenated ligand compound may be exposed to the inner surfaces of the processing chamber or the substrate with or without a carrier gas. In many examples, the treatment gas contains at least one carrier gas as well as the hydrogenated ligand compound. The carrier gas of the treatment gas may be ammonia, argon, nitrogen, hydrogen, helium, or mixtures thereof. In an alternative embodiment, such as for forming oxides or other materials, the carrier gas of the treatment gas may include oxygen, nitrous oxide, or air.

The processing chamber and the substrate may be exposed to the treatment gas having a gas flow rate within a range from about 0.5 slm to about 20 slm, preferably, from about 1 slm to about 16 slm, and more preferably, from about 2 slm to about 8 slm, such as about 4 slm during step 202. The treatment gas may be formed by flowing the carrier gas through an ampoule or a bubbler containing the hydrogenated ligand compound. Alternatively, the treatment gas may be formed by co-flowing the hydrogenated ligand compound with the carrier gas. The hydrogenated ligand compound may have a gas flow rate within a range from about 5 sccm to about 1,000 sccm, preferably, from about 25 sccm to about 500 sccm, and more preferably, from about 50 sccm to about 150 sccm, such as about 100 sccm. In one example, the treatment gas contains an alkylamine compound, such as methylamine, dimethylamine, or derivatives thereof, as well as at least one carrier gas. In one example, the treatment gas may contain dimethylamine with a flow rate of about 100 sccm and argon with a flow rate of about 4 slm. In another example, the treatment gas may contain dimethylamine with a flow rate of about 20 sccm, ammonia with a flow rate of about 1 slm, and argon with a flow rate of about 8 slm. The processing chamber and/or substrate may be exposed to the treatment gas containing the hydrogenated ligand or other reagent for a time period within a range from about 2 seconds to about 120 seconds, preferably, from about 5 seconds to about 60 seconds, for example, about 20 seconds or about 40 seconds.

In one embodiment, a first pulse of purge gas is administered into the processing chamber and across the substrate during step 204. A vacuum system removes gases from the processing chamber during steps 204 and 208. During step 206, the substrate is exposed to a pulse of the tantalum precursor. The PDMAT adsorbs to the substrate forming a monolayer. A second pulse of purge gas removes excess PDMAT and any gaseous contaminants during step 208. During step 210, a nitrogen precursor is pulsed into the chamber and across the substrate. The nitrogen precursor reacts with the adsorbed PDMAT to form a tantalum-containing material, such as tantalum nitride. At step 212, if the desired tantalum nitride layer thickness is achieved, then the deposition process is ended at step 214. However, multiple cycles of steps 204-212 are generally repeated before achieving the desired tantalum nitride layer thickness. In one example, PDMAT and ammonia are sequentially pulsed for 20 cycles to deposit a film with a thickness about 10 Å.

During the pretreatment process and the deposition process, the processing chamber and the substrate may be maintained approximately below a thermal decomposition temperature of the selected chemical precursor, such as PDMAT. An exemplary temperature of the processing chamber, the substrate, and/or the substrate pedestal during the pretreatment process and the deposition process may be within a range from about 100° C. to about 500° C., preferably, from about 200° C. to about 400° C., and more preferably, from about 250° C. to about 300° C. The processing chamber may contain a chamber body and a chamber lid, which each may independently be heated to a temperature within a range from about 25° C. to about 300° C., preferably, from about 30° C. to about 100° C., and more preferably, from about 40° C. to about 80° C. The processing chamber may have an internal pressure within a range from about 1 mTorr to about 100 Torr, preferably, from about 1 Torr to about 50 Torr, and more preferably, from about 5 Torr to about 20 Torr, such as about 10 Torr.

The tantalum precursor gas may be formed by flowing the argon carrier gas through the ampoule of preheated PDMAT as described above. The substrate may be exposed to the tantalum precursor gas containing PDMAT for a period of time within a range from about 0.1 seconds to about 3.0 seconds, preferably, from about 0.5 seconds to about 1.5 seconds, and more preferably about 1 second. After the pulse of the tantalum precursor gas, a pulse of purge gas may be injected into the processing chamber and the vacuum system removes the various gases from the interior of the processing chamber for a time period within a range from about 0.2 seconds to about 5.0 seconds, preferably, from about 0.25 seconds to about 1.5 seconds, and more preferably, about 0.5 seconds. Subsequently, the substrate is exposed to a pulse of a nitrogen precursor gas or a nitrogen-containing process gas containing ammonia. The nitrogen precursor gas may include the nitrogen precursor in a carrier gas or may be solely the nitrogen precursor. The nitrogen precursor gas containing ammonia may be delivered at a rate from about 1,000 sccm to about 3,000 sccm, preferably about 1,500 sccm and exposed to the substrate for a period of time within a range from about 0.1 seconds to about 3.0 seconds, preferably, from about 0.5 seconds to about 1.5 seconds, and more preferably about 1 second. After the pulse of the nitrogen precursor gas, another pulse of purge gas may be injected into the processing chamber and the vacuum system removes the various gases from the interior of the processing chamber for a time period within a range from about 0.2 seconds to about 5.0 seconds, preferably, from about 0.25 seconds to about 1.5 seconds, and more preferably, about 0.5 seconds. The ALD cycle is repeated until a predetermined thickness of the tantalum-containing layer, such as tantalum nitride, is achieved, such as within a range from about 5 Å to about 200 Å, preferably, from about 10 Å to about 30 Å, such as about 20 Å.

The time duration for each pulse of tantalum-containing gas, pulse of the nitrogen-containing gas, and pulse of purge gas between pulses of the reactants are variable and depend on the volume capacity of a deposition chamber employed as well as a vacuum system coupled thereto. For example, (1) a lower chamber pressure of a gas will require a longer pulse time; (2) a lower gas flow rate will require a longer time for chamber pressure to rise and stabilize requiring a longer pulse time; and (3) a large-volume chamber will take longer to fill, longer for chamber pressure to stabilize thus requiring a longer pulse time. Similarly, time between each pulse is also variable and depends on volume capacity of the processing chamber as well as the vacuum system coupled thereto. In general, the time duration of a pulse of the tantalum-containing gas or the nitrogen-containing gas should be long enough for adsorption or reaction of a monolayer of the compound. In one aspect, a pulse of a tantalum-containing gas may still be in the chamber when a pulse of a nitrogen-containing gas enters. In general, the duration of the purge gas and/or pump evacuation should be long enough to prevent the pulses of the tantalum-containing gas and the nitrogen-containing gas from mixing together in the reaction zone.

In another embodiment, the processing chamber may be exposed to a treatment gas during a pretreatment process prior to forming other materials on the substrate thereon. In one example, the hydrogenated ligand compound may be an alkylamine compound, such as methylamine or dimethylamine, while PDMAT may be used as a tantalum precursor to form other tantalum-containing material, such as tantalum oxide, tantalum silicon nitride, tantalum boron nitride, tantalum phosphorous nitride, tantalum oxynitride, or tantalum silicate. A more detailed description of a process to form ternary or quaternary elemental tantalum-containing materials is described in commonly assigned U.S. Pat. No. 7,081,271, which is herein incorporated by reference in its entirety.

Processes 100 and 200 may be modified in order to obtain ternary tantalum-containing materials. For example, a tantalum silicon nitride material may be formed if the substrate is exposed to a pulse of a silicon precursor as an additional step of the ALD cycle containing the pulses of the tantalum precursor gas and a nitrogen precursor. Similar, a tantalum oxynitride material may be formed if the substrate is exposed to a pulse of an oxygen precursor as an additional step of the ALD cycle containing the pulses of the tantalum precursor gas and a nitrogen precursor. In another example, a tantalum silicate material may be formed if the substrate is exposed to a pulse of the tantalum precursor gas, a pulse of a silicon precursor, and a pulse of an oxygen precursor during the ALD cycle. In another example, a tantalum oxide material may be formed if the substrate is exposed to a pulse of the tantalum precursor gas and a pulse of an oxygen precursor during the ALD cycle. In another example, a tantalum phosphorous nitride material may be formed if the substrate is exposed to a pulse of the tantalum precursor gas, a pulse of a nitrogen precursor and a pulse of a phosphorous precursor (e.g., phosphine) during the ALD cycle. In another example, a tantalum boron nitride material may be formed if the substrate is exposed to a pulse of the tantalum precursor gas, a pulse of a nitrogen precursor and a pulse of a boron precursor (e.g., diborane) during the ALD cycle.

In one embodiment, tantalum nitride material may be formed or deposited with the chemical formula TaNx, where x is within a range from about 0.4 to about 2.0. In some examples, the tantalum nitride materials may be formed with empirical formulas of TaN, $Ta_3N_5$, $Ta_2N$, or $Ta_6N_{2.57}$. The tantalum nitride materials may be deposited as amorphous or crystalline materials. The ALD process provides stoichiometric control during the deposition of the tantalum nitride materials. The stoichiometry may be altered by various procedures following the deposition process, such as when $Ta_3N_5$ is thermally annealed to form TaN. The ratio of the precursors may be altered during deposition to control the stoichiometry of the tantalum nitride materials.

In the examples above, the various tantalum materials, such as tantalum nitride, may be formed by ALD processes which utilize the tantalum precursor PDMAT and the hydrogenated ligand compound dimethylamine. However, other chemical precursors and hydrogenated ligand compounds are within the scope of embodiments of the invention.

An important characteristic for a chemical precursor used in a vapor deposition process is to have a favorable vapor pressure. The chemical precursor may have a gaseous state, a liquid state, or a solid state at ambient temperature and/or pressure. However, within the vapor deposition system, precursors are volatilized to a gas and delivered to the ALD or CVD processing chamber. The chemical precursors are usually heated prior to being delivered into the processing chamber.

Tantalum precursors may contain ligands such as alkylamino, alkylimino, cyclopentadienyl, alkylcyclopentadienyl, pentadienyl, alkyl, alkene, alkyne, alkoxyl, isomers thereof, derivatives thereof, or combinations thereof. Alkylamino tantalum compounds used as tantalum precursors include $(RR'N)_5Ta$, where each of R or R' is independently hydrogen, methyl, ethyl, propyl, or butyl. Alkylimino tantalum compounds used as tantalum precursors include $(RN)(R'R''N)_3Ta$, where each of R, R', or R'' is independently hydrogen, methyl, ethyl, propyl, butyl, or pentyl (amyl).

Exemplary tantalum precursors include pentakis(dimethylamino) tantalum (PDMAT, $(Me_2N)_5Ta$), pentakis(diethylamino) tantalum (PDEAT, $(Et_2N)_5Ta$), pentakis(ethylmethylamino) tantalum (PEMAT, $(EtMeN)_5Ta$), tert-butylimino tris(dimethylamino) tantalum (TBTDMT, $(^tBuN)Ta(NMe_2)_3$), tert-butylimino tris(diethylamino) tantalum (TBTDET, $(^tBuN)Ta(NEt_2)_3$), tert-butylimino tris(ethylmethylamino) tantalum (TBTEMT, $(^tBuN)Ta(NMeEt)_3$), tert-amylimino-tris(dimethylamino) tantalum (TAIMATA, $(^tAmylN)Ta(NMe_2)_3$), tert-amylimino-tris(diethylamino) tantalum $(({}^tAmylN)Ta(NEt_2)_3)$, tert-amylimino-tris(ethylmethylamino) tantalum $(({}^tAmylN)Ta(NEtMe)_3)$, bis(cyclopentadienyl) tantalum trihydride ($CP_2TaH_3$), bis(methylcyclopentadienyl) tantalum trihydride ($(MeCp)_2TaH_3$), bis(pentamethylcyclopentadienyl) tantalum trihydride ($(Me_5Cp)_2TaH_3$), tantalum methoxide ($(MeO)_5Ta$), tantalum ethoxide ($(EtO)_5Ta$), tantalum propoxide ($(PrO)_5Ta$), tantalum butoxide ($(BuO)_5Ta$), isomers thereof, or derivatives thereof.

"TAIMATA" is used herein to describe tertiaryamyliminotris(dimethylamino) tantalum with the chemical formula $(^tAmylN)Ta(NMe_2)_3$, wherein $^tAmyl$ is the tertiaryamyl (tert-amyl) group ($C_5H_{11}$— or $CH_3CH_2C(CH_3)_2$—). In one embodiment, a tantalum-containing gas may be formed by heating a liquid TAIMATA precursor in a vaporizer, a bubbler or an ampoule to a temperature of at least 30° C., preferably to a temperature within a range from about 50° C. to about 80° C. A carrier gas may be flown across or bubbled through the heated TAIMATA to form a tantalum-containing gas.

Besides tantalum precursors, other chemical precursors may also be used in vapor deposition processes, as described by embodiments herein. Exemplary chemical precursors that may also be used in vapor deposition (e.g., ALD or CVD) processes include titanium precursors, tungsten precursors, hafnium precursors, zirconium precursors, aluminum precursors, cobalt precursors, ruthenium precursors, copper precursors, silicon precursors, nitrogen precursors, oxygen precursors, as well as other chemical precursors. Materials that may be formed or deposited include a variety of metals, nitrides, oxides, silicides, including metallic tantalum, tantalum nitride, tantalum oxide, tantalum oxynitride, tantalum silicide, tantalum silicide nitride, metallic titanium, titanium nitride, titanium oxide, titanium oxynitride, titanium silicide, titanium silicide nitride, metallic tungsten, tungsten nitride, tungsten oxide, tungsten boronitride, tungsten silicide, tungsten silicide nitride, tungsten boride, metallic hafnium, hafnium nitride, hafnium oxide, hafnium oxynitride, hafnium silicide, hafnium silicon nitride, hafnium silicate, hafnium silicon oxynitride, metallic zirconium, zirconium nitride, zirconium oxide, zirconium oxynitride, zirconium silicide, zirconium silicon nitride, zirconium silicate, zirconium silicon oxynitride, metallic aluminum, aluminum nitride, aluminum oxide, aluminum oxynitride, aluminum silicide, aluminum silicon nitride, aluminum silicate, aluminum silicon oxynitride, metallic cobalt, cobalt silicide, metallic ruthenium, metallic copper, copper alloys, derivatives thereof, alloys thereof, or combinations thereof.

In another embodiment, the treatment gas contains a hydrogenated ligand compound having the chemical formula of HL, where L is a ligand such as alkylamino, alkylimino, alkoxy, alkyl, alkene, alkyne, cyclopentadienyl, alkylcyclopentadienyl, pentadienyl, pyrrolyl, or derivatives thereof. In some examples, such as when the metal precursor is an alkylamino metal precursor, the treatment gas contains a hydrogenated ligand compound which may be an alkylamine compound having the chemical formula of $H_2NR$ or $HNR'R''$, where each R, R', and R'' is independently methyl, ethyl, propyl, butyl, amyl, phenyl, aryl, isomers thereof, derivatives thereof, or combinations thereof. The alkylamine compound may be methylamine, dimethylamine, ethylamine, diethylamine, methylethylamine, propylamine, dipropylamine, butylamine, dibutylamine, isomers thereof, derivatives thereof, or combinations thereof. In some examples, the treatment gas further contains at least one carrier gas such as ammonia, hydrogen, nitrogen, argon, helium, or combinations thereof. In one example, the treatment gas contains dimethylamine, ammonia, and another carrier gas, such as argon.

In other examples, the treatment gas contains a hydrogenated ligand compound which may be an alcohol compound having the chemical formula of ROH, where R is methyl, ethyl, propyl, butyl, amyl, isomers thereof, or derivatives thereof. The alcohol compound may be methanol, ethanol, propanol, butanol, pentanol, isomers thereof, derivatives thereof, or combinations thereof. In other examples, the chemical precursor contains an alkoxy ligand such as $OCH_3$, $OC_2H_5$, $OC_3H_7$, $OC_4H_9$, isomers thereof, or derivatives thereof.

In other embodiments, the precursor gas contains a chemical precursor having the chemical formula of $ML'_x$, where x is 1, 2, 3, 4, 5, 6, or greater, M is an element such as Ti, Zr, Hf, Nb, Ta, Mo, W, Ru, Co, Ni, Pd, Pt, Cu, Al, Ga, In, Si, Ge, Sn, P, As, or Sb, and each L' is independently a ligand such as alkylamino, alkylimino, alkoxy, alkyl, alkene, alkyne, cyclopentadienyl, alkylcyclopentadienyl, pentadienyl, pyrrolyl, hydrogen, halogen, derivatives thereof, or combinations thereof.

In one embodiment, the ligand L of the hydrogenated ligand compound may be cyclopentadienyl, alkylcyclopentadienyl, pentadienyl, pyrrolyl, isomers thereof, or derivatives thereof and the ligand L' of the chemical precursor may be cyclopentadienyl, alkylcyclopentadienyl, pentadienyl, pyrrolyl, isomers thereof, or derivatives thereof.

In some examples, the precursor gas contains the alkylamino metal precursor gas contains an alkylamino metal precursor having the chemical formula of $ML'_x$, where x is 1, 2, 3, 4, 5, 6, or greater, M may be a metal or other element such as Ti, Zr, Hf, Ta, Mo, W, or Si, and each ligand L' is independently a ligand, such as an alkylamino ligand, which include $N(CH_3)_2$, $N(C_2H_5)_2$, $N(C_3H_7)_2$, $N(C_4H_9)_2$, $N(CH_3)(C_2H_5)$, isomers thereof, derivatives thereof, or combinations thereof. In some examples, metal/element M may be Si, Ti, Zr, or Hf while x is usually 4. In other examples, the alkylamino metal precursor is a tantalum precursor with metal M being Ta while x is usually 4 or 5.

In other examples, the hydrogenated ligand compound may be an alcohol compound having the chemical formula of ROH, where R is methyl, ethyl, propyl, butyl, amyl, isomers thereof, or derivatives thereof. The alcohol compound may be methanol, ethanol, propanol, butanol, pentanol, isomers thereof, derivatives thereof, or combinations thereof. In other examples, the first precursor contains an alkoxy ligand such as $OCH_3$, $OC_2H_5$, $OC_3H_7$, $OC_4H_9$, isomers thereof, or derivatives thereof. In other examples, the ligand L of the hydrogenated ligand compound may be cyclopentadienyl, alkylcyclopentadienyl, pentadienyl, pyrrolyl, isomers thereof, or derivatives thereof and the ligand L' of the first precursor may be cyclopentadienyl, alkylcyclopentadienyl, pentadienyl, pyrrolyl, isomers thereof, or derivatives thereof.

Titanium precursors useful for depositing materials as described herein include tetrakis(dimethylamino) titanium (TDMAT), tetrakis(ethylmethylamino) titanium (TEMAT), tetrakis(diethylamino) titanium (TDEAT), or derivatives thereof.

Tungsten precursors useful for depositing materials as described herein include bis(tert-butylimino)-bis(dimethylamino) tungsten (($^t$BuN)$_2$W(NMe$_2$)$_2$), bis(tert-butylimino)-bis(diethylamino) tungsten (($^t$BuN)$_2$W(NEt$_2$)$_2$), bis(tert-butylimino)-bis(ethylmethylamino) tungsten (($^t$BuN)$_2$W(NEtMe)$_2$), or derivatives thereof.

Hafnium alkylamino compounds useful as hafnium precursors include $(RR'N)_4Hf$, where each R and R' is independently hydrogen, methyl, ethyl, propyl, butyl, amyl, or isomers thereof. Hafnium precursors useful for depositing materials as described herein include tetrakis(diethylamino) hafnium ((Et$_2$N)$_4$Hf, TDEAH), tetrakis(dimethylamino) hafnium ((Me$_2$N)$_4$Hf, TDMAH), tetrakis(ethylmethylamino) hafnium ((EtMeN)$_4$Hf, TEMAH), hafnium tetramethoxide ((MeO)$_4$Hf), hafnium tetraethoxide ((EtO)$_4$Hf), hafnium tetrapropoxide ((PrO)$_4$Hf), hafnium tetrabutoxide ((BuO)$_4$Hf), isomers thereof, or derivatives thereof. Other hafnium precursors may include hafnium chloride (HfCl$_4$), hafnium iodide (HfI$_4$), ($^t$BuC$_5$H$_4$)$_2$HfCl$_2$, (C$_5$H$_5$)$_2$HfCl$_2$, (EtC$_5$H$_4$)$_2$HfCl$_2$, (Me$_5$C$_5$)$_2$HfCl$_2$, (Me$_5$C$_5$)HfCl$_3$, ($^i$PrC$_5$H$_4$)$_2$HfCl$_2$, ($^i$PrC$_5$H$_4$)HfCl$_3$, ($^t$BUC$_5$H$_4$)$_2$HfMe$_2$, (acac)$_4$Hf, (hfac)$_4$Hf, (tfac)$_4$Hf, (thd)$_4$Hf, (NO$_3$)$_4$Hf, or derivatives thereof.

Zirconium alkylamino compounds useful as zirconium precursors include $(RR'N)_4Zr$, where each R and R' is independently hydrogen, methyl, ethyl, propyl, butyl, amyl, or isomers thereof. Zirconium precursors useful for depositing materials as described herein include tetrakis(diethylamino) zirconium ((Et$_2$N)$_4$Zr), tetrakis(dimethylamino) zirconium ((Me$_2$N)$_4$Zr), tetrakis(ethylmethylamino) zirconium ((EtMeN)$_4$Zr), zirconium tetramethoxide ((MeO)$_4$Zr), zirconium tetraethoxide ((EtO)$_4$Zr), zirconium tetrapropoxide ((PrO)$_4$Zr), zirconium tetrabutoxide ((BuO)$_4$Zr), isomers thereof, or derivatives thereof. Other zirconium precursors may include zirconium chloride (ZrCl$_4$), zirconium iodide (ZrI$_4$), ($^t$BuC$_5$H$_4$)$_2$ZrCl$_2$, (C$_5$H$_5$)$_2$ZrCl$_2$, (EtC$_5$H$_4$)$_2$ZrCl$_2$, (Me$_5$C$_5$)$_2$ZrCl$_2$, (Me$_5$C$_5$)ZrCl$_3$, ($^i$PrC$_5$H$_4$)$_2$ZrCl$_2$, ($^i$PrC$_5$H$_4$)ZrCl$_3$, ($^t$BuC$_5$H$_4$)$_2$ZrMe$_2$, (acac)$_4$Zr, (Zrac)$_4$Zr, (tfac)$_4$Zr, (thd)$_4$Zr, (NO$_3$)$_4$Zr, or derivatives thereof.

Aluminum precursors useful for depositing materials as described herein include aluminum methoxide ((MeO)$_3$Al), aluminum ethoxide ((EtO)$_3$Al), aluminum propoxide ((PrO)$_3$Al), aluminum butoxide ((BuO)$_3$Al), or derivatives thereof.

Silicon precursors useful for depositing materials as described herein include silane compounds, alkylamino silane compounds, silanol, or alkoxysilane compounds, as well as other silicon containing compounds. Alkylamino silane compounds useful as silicon precursors include $(RR'N)_{4-n}SiH_n$, where R or R' are independently hydrogen, methyl, ethyl, propyl, butyl, amyl, isomers thereof, or derivatives thereof and n is 0, 1, 2, or 3. Alkoxy silane compounds may be described by the generic chemical formula $(RO)_{4-n}SiL_n$, where R is methyl, ethyl, propyl, butyl, amyl, isomers thereof, or derivatives thereof and L is H, OH, F, Cl, Br, I, methyl, ethyl, propyl, butyl, or mixtures thereof, and n is 0, 1, 2, or 3. Silicon precursors may include tetrakis(dimethylamino) silane (($Me_2N)_4Si$, DMAS), tris(dimethylamino) silane (($Me_2N)_3SiH$, Tris-DMAS), bis(dimethylamino) silane (($Me_2N)_2SiH_2$), dimethylamino silane (($Me_2N)SiH_3$), tetrakis(diethylamino) silane (($Et_2N)_4Si$)), tris(diethylamino) silane (($Et_2N)_3SiH$), tetrakis(methylethylamino) silane (($MeEtN)_4Si$), tris(methylethylamino) silane (($MeEtN)_3SiH$), tetramethoxysilane (($MeO)_4Si$), tetraethoxysilane (($EtO)_4Si$), isomers thereof, derivatives thereof, or combinations thereof. Other silicon precursors that may be used in vapor deposition processes described herein include silane ($SiH_4$), disilane ($Si_2H_6$), tetrachlorosilane ($SiCl_4$), hexachlorodisilane ($Si_2Cl_6$), tetraisocyanate silane ($Si(NCO)_4$), trisocyanate methylsilane ($MeSi(NCO)_3$), or derivatives thereof.

In another embodiment, a family of ruthenium precursors useful to form a ruthenium material during the deposition process described herein includes pyrrolyl ruthenium precursors. During a pretreatment process of the processing chamber and/or the substrate, the hydrogenated ligand compound within the treatment gas may be a hydrogenated pyrrolyl ligand, pyridine, or derivatives thereof. In one example, a pyrrolyl ruthenium precursor contains ruthenium and at least one pyrrolyl ligand or at least one pyrrolyl derivative ligand. A pyrrolyl ruthenium precursor may have a pyrrolyl ligand, such as, for example:

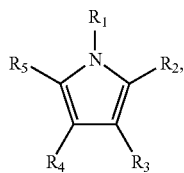

where $R_1$, $R_2$, $R_3$, $R_4$, and $R_5$ is each independently absent, hydrogen, an alkyl group (e.g., methyl, ethyl, propyl, butyl, amyl, or higher), an amine group, an alkoxy group, an alcohol group, an aryl group, another pyrrolyl group (e.g., 2,2'-bipyrrolyl), a pyrazole group, derivatives thereof, or combinations thereof. The pyrrolyl ligand may have any two or more of $R_1$, $R_2$, $R_3$, $R_4$, and $R_5$ connected together by a chemical group. For example, $R_2$ and $R_3$ may be a portion of a ring structure such as an indolyl group or derivative thereof. A pyrrolyl ruthenium precursor as used herein refers to any chemical compound containing ruthenium and at least one pyrrolyl ligand or at least one derivative of a pyrrolyl ligand. In some examples, a pyrrolyl ruthenium precursor may include bis(tetramethylpyrrolyl) ruthenium, bis(2,5-dimethylpyrrolyl) ruthenium, bis(2,5-diethylpyrrolyl) ruthenium, bis(tetraethylpyrrolyl) ruthenium, pentadienyl tetramethylpyrrolyl ruthenium, pentadienyl 2,5-dimethylpyrrolyl ruthenium, pentadienyl tetraethylpyrrolyl ruthenium, pentadienyl 2,5-diethylpyrrolyl ruthenium, 1,3-dimethylpentadienyl pyrrolyl ruthenium, 1,3-diethylpentadienyl pyrrolyl ruthenium, methylcyclopentadienyl pyrrolyl ruthenium, ethylcyclopentadienyl pyrrolyl ruthenium, 2-methylpyrrolyl pyrrolyl ruthenium, 2-ethylpyrrolyl pyrrolyl ruthenium, or derivatives thereof.

A pyrrolyl ligand, as used herein, may be abbreviated by "py" and a pyrrolyl derivative ligand may be abbreviated by "R-py." Exemplary pyrrolyl ruthenium precursors useful to form a ruthenium material during the deposition process described herein include alkyl pyrrolyl ruthenium precursors (e.g., ($R_x$-py)Ru), bis(pyrrolyl) ruthenium precursors (e.g., ($Py)_2Ru$) and dienyl pyrrolyl ruthenium precursors (e.g., (Cp)(py)Ru). Examples of alkyl pyrrolyl ruthenium precursors include methylpyrrolyl ruthenium, ethylpyrrolyl ruthenium, propylpyrrolyl ruthenium, dimethylpyrrolyl ruthenium, diethylpyrrolyl ruthenium, dipropylpyrrolyl ruthenium, trimethylpyrrolyl ruthenium, triethylpyrrolyl ruthenium, tetramethylpyrrolyl ruthenium, tetraethylpyrrolyl ruthenium, or derivatives thereof. Examples of bis(pyrrolyl) ruthenium precursors include bis(pyrrolyl) ruthenium, bis(methylpyrrolyl) ruthenium, bis(ethylpyrrolyl) ruthenium, bis(propylpyrrolyl) ruthenium, bis(dimethylpyrrolyl) ruthenium, bis(diethylpyrrolyl) ruthenium, bis(dipropylpyrrolyl) ruthenium, bis(trimethylpyrrolyl) ruthenium, bis(triethylpyrrolyl) ruthenium, bis(tetramethylpyrrolyl) ruthenium, bis(tetraethylpyrrolyl) ruthenium, methylpyrrolyl pyrrolyl ruthenium, ethylpyrrolyl pyrrolyl ruthenium, propylpyrrolyl pyrrolyl ruthenium, dimethylpyrrolyl pyrrolyl ruthenium, diethylpyrrolyl pyrrolyl ruthenium, dipropylpyrrolyl pyrrolyl ruthenium, trimethylpyrrolyl pyrrolyl ruthenium, triethylpyrrolyl pyrrolyl ruthenium, tetramethylpyrrolyl pyrrolyl ruthenium, tetraethylpyrrolyl pyrrolyl ruthenium, or derivatives thereof.

A dienyl pyrrolyl ruthenium precursor contains at least one dienyl ligand and at least one pyrrolyl ligand. The dienyl ligand may contain a carbon backbone with as little as four carbon atoms or as many as about ten carbon atoms, preferably, about five or six. The dienyl ligand may have a ring structure (e.g., cyclopentadienyl) or may be an open alkyl chain (e.g., pentadienyl). Also, dienyl ligand may contain no alkyl groups, one alkyl group, or many alkyl groups.

In one embodiment, the dienyl pyrrolyl ruthenium precursor contains a pentadienyl ligand or an alkylpentadienyl ligand. Examples of pentadienyl pyrrolyl ruthenium precursors include pentadienyl pyrrolyl ruthenium, pentadienyl methylpyrrolyl ruthenium, pentadienyl ethylpyrrolyl ruthenium, pentadienyl propylpyrrolyl ruthenium, pentadienyl dimethylpyrrolyl ruthenium, pentadienyl diethylpyrrolyl ruthenium, pentadienyl dipropylpyrrolyl ruthenium, pentadienyl trimethylpyrrolyl ruthenium, pentadienyl triethylpyrrolyl ruthenium, pentadienyl tetramethylpyrrolyl ruthenium, pentadienyl tetraethylpyrrolyl ruthenium, or derivatives thereof. Examples of alkylpentadienyl pyrrolyl ruthenium precursors include alkylpentadienyl pyrrolyl ruthenium, alkylpentadienyl methylpyrrolyl ruthenium, alkylpentadienyl ethylpyrrolyl ruthenium, alkylpentadienyl propylpyrrolyl ruthenium, alkylpentadienyl dimethylpyrrolyl ruthenium, alkylpentadienyl diethylpyrrolyl ruthenium, alkylpentadienyl dipropylpyrrolyl ruthenium, alkylpentadienyl trimethylpyrrolyl ruthenium, alkylpentadienyl triethylpyrrolyl ruthenium, alkylpentadienyl tetramethylpyrrolyl ruthenium, alkylpentadienyl tetraethylpyrrolyl ruthenium, or derivatives thereof.

In another embodiment, the dienyl pyrrolyl ruthenium precursor contains a cyclopentadienyl ligand or an alkylcyclopentadienyl ligand. Examples of cyclopentadienyl pyrrolyl ruthenium precursors include cyclopentadienyl pyrrolyl ruthenium, cyclopentadienyl methylpyrrolyl ruthenium, cyclopentadienyl ethylpyrrolyl ruthenium, cyclopentadienyl propylpyrrolyl ruthenium, cyclopentadienyl dimethylpyrrolyl ruthenium, cyclopentadienyl diethylpyrrolyl ruthenium, cyclopentadienyl dipropylpyrrolyl ruthenium, cyclopentadienyl trimethylpyrrolyl ruthenium, cyclopentadienyl triethylpyrrolyl ruthenium, cyclopentadienyl tetramethylpyrrolyl ruthenium, cyclopentadienyl tetraethylpyrrolyl ruthenium, or derivatives thereof. Examples of alkylcyclopentadienyl pyrrolyl ruthenium precursors include alkylcyclopentadienyl pyrrolyl ruthenium, alkylcyclopentadienyl methylpyrrolyl ruthenium, alkylcyclopentadienyl ethylpyrrolyl ruthenium, alkylcyclopentadienyl propylpyrrolyl ruthenium, alkylcyclopentadienyl dimethylpyrrolyl ruthenium, alkylcyclopentadienyl diethylpyrrolyl ruthenium, alkylcyclopentadienyl dipropylpyrrolyl ruthenium, alkylcyclopentadienyl trimethylpyrrolyl ruthenium, alkylcyclopentadienyl triethylpyrrolyl ruthenium, alkylcyclopentadienyl tetramethylpyrrolyl ruthenium, alkylcyclopentadienyl tetraethylpyrrolyl ruthenium, or derivatives thereof.

In another embodiment, a ruthenium precursor may contain no pyrrolyl ligand or pyrrolyl derivative ligand, but instead, contains at least one open chain dienyl ligand, such as $CH_2CRCHCRCH_2$, where R is independently an alkyl group or hydrogen. A ruthenium precursor may have two open-chain dienyl ligands, such as pentadienyl or heptadienyl. A bis(pentadienyl) ruthenium compound has a generic chemical formula $(CH_2CRCHCRCH_2)_2Ru$, where R is independently an alkyl group or hydrogen. Usually, R is independently hydrogen, methyl, ethyl, propyl or butyl. Therefore, ruthenium precursors may include bis(dialkylpentadienyl) ruthenium compounds, bis(alkylpentadienyl) ruthenium compounds, bis(pentadienyl) ruthenium compounds, or combinations thereof. Examples of ruthenium precursors include bis(2,4-dimethylpentadienyl) ruthenium, bis(2,4-diethylpentadienyl) ruthenium, bis(2,4-diisopropylpentadienyl) ruthenium, bis(2,4-ditertbutylpentadienyl) ruthenium, bis(methylpentadienyl)ruthenium, bis(ethylpentadienyl) ruthenium, bis (isopropylpentadienyl) ruthenium, bis(tertbutylpentadienyl) ruthenium, derivatives thereof, or combinations thereof. In some embodiments, other ruthenium precursors include tris (2,2,6,6-tetramethyl-3,5-heptanedionato) ruthenium, dicarbonyl pentadienyl ruthenium, ruthenium acetyl acetonate, 2,4-dimethylpentadienyl cyclopentadienyl ruthenium, bis(2, 2,6,6-tetramethyl-3,5-heptanedionato) (1,5-cyclooctadiene) ruthenium, 2,4-dimethylpentadienyl methylcyclopentadienyl ruthenium, 1,5-cyclooctadiene cyclopentadienyl ruthenium, 1,5-cyclooctadiene methylcyclopentadienyl ruthenium, 1,5-cyclooctadiene ethylcyclopentadienyl ruthenium, 2,4-dimethylpentadienyl ethylcyclopentadienyl ruthenium, 2,4-dimethylpentadienyl isopropylcyclopentadienyl ruthenium, bis(N,N-dimethyl 1,3-tetramethyl diiminato) 1,5-cyclooctadiene ruthenium, bis(N,N-dimethyl 1,3-dimethyl diiminato) 1,5-cyclooctadiene ruthenium, bis(allyl) 1,5-cyclooctadiene ruthenium, $\eta^6$-$C_6H_6$ 1,3-cyclohexadiene ruthenium, bis(1,1-dimethyl-2-aminoethoxylato) 1,5-cyclooctadiene ruthenium, bis(1,1-dimethyl-2-aminoethylaminato) 1,5-cyclooctadiene ruthenium, bis(cyclopentadienyl) ruthenium, bis(methylcyclopentadienyl) ruthenium, bis(ethylcyclopentadienyl) ruthenium, and bis(pentamethylcyclopentadienyl) ruthenium, or derivatives thereof.

Cobalt precursors useful for depositing materials as described herein include cobalt carbonyl complexes, cobalt amidinates compounds, cobaltocene compounds, cobalt dienyl complexes, cobalt nitrosyl complexes, derivatives thereof, complexes thereof, plasma thereof, or combinations thereof. In some embodiments, cobalt materials may be deposited by CVD and ALD processes further described in commonly assigned U.S. Pat. Nos. 7,1164,846 and 7,404, 985, which are herein incorporated by reference.

In some embodiments, cobalt carbonyl compounds or complexes may be utilized as cobalt precursors. Cobalt carbonyl compounds or complexes have the general chemical formula $(CO)_xCo_yL_z$, where X may be 1, 2, 3, 4, 5, 6, 7, 8, 9, 10, 11, or 12, Y may be 1, 2, 3, 4, or 5, and Z may be 1, 2, 3, 4, 5, 6, 7, or 8. The group L is absent, one ligand or multiple ligands, that may be the same ligand or different ligands, and include cyclopentadienyl, alkylcyclopentadienyl (e.g., methylcyclopentadienyl or pentamethylcyclopentadienyl), pentadienyl, alkylpentadienyl, cyclobutadienyl, butadienyl, ethylene, allyl (or propylene), alkenes, dialkenes, alkynes, acetylene, butylacetylene, nitrosyl, ammonia, or derivatives thereof.

In one embodiment, dicobalt hexacarbonyl acetyl compounds may be used to form cobalt materials (e.g., cobalt layer 220) during a deposition process. Dicobalt hexacarbonyl acetyl compounds may have the chemical formula of $(CO)_6Co_2(RC\equiv CR')$, wherein R and R' are independently hydrogen, methyl, ethyl, propyl, isopropyl, butyl, tertbutyl, amyl, benzyl, aryl, isomers thereof, derivatives thereof, or combinations thereof. In one example, dicobalt hexacarbonyl butylacetylene (CCTBA, $(CO)_6Co_2(HC\equiv C^tBu)$) is the cobalt precursor. Other examples of dicobalt hexacarbonyl acetyl compounds include dicobalt hexacarbonyl methylbutylacetylene ($(CO)_6Co_2(MeC\equiv C^tBu)$), dicobalt hexacarbonyl phenylacetylene ($(CO)_6Co_2(HC\equiv CPh)$), dicobalt hexacarbonyl methylphenylacetylene ($(CO)_6Co_2(MeC\equiv CPh)$), dicobalt hexacarbonyl methylacetylene ($(CO)_6Co_2(HC\equiv CMe)$), dicobalt hexacarbonyl dimethylacetylene ($(CO)_6Co_2(MeC\equiv CMe)$), derivatives thereof, complexes thereof, plasmas thereof, or combinations thereof. Other exemplary cobalt carbonyl complexes include cyclopentadienyl cobalt bis(carbonyl) ($CpCo(CO)_2$), tricarbonyl allyl cobalt ($(CO)_3Co(CH_2CH\equiv CH_2)$), or derivatives thereof.

In another embodiment, cobalt amidinates or cobalt amino complexes may be utilized as cobalt precursors. Cobalt amino complexes have the general chemical formula $(RR'N)_xCo$, where X may be 1, 2, or 3, and R and R' are independently hydrogen, methyl, ethyl, propyl, butyl, alkyl, silyl, alkylsilyl, derivatives thereof, or combinations thereof. Some exemplary cobalt amino complexes include bis(di(butyldimethylsilyl)amino) cobalt ($((BuMe_2Si)_2N)_2Co$), bis(di(ethyldimethylsilyl)amino) cobalt ($((EtMe_2Si)_2N)_2Co$), bis(di (propyldimethylsilyl)amino) cobalt ($((PrMe_2Si)_2N)_2Co$), bis (di(trimethylsilyl)amino) cobalt ($((Me_3Si)_2N)_2Co$), tris(di (trimethylsilyl)amino) cobalt ($((Me_3Si)_2N)_3Co$), or derivatives thereof.

Some exemplary cobalt precursors include methylcyclopentadienyl cobalt bis(carbonyl) ($MeCpCo(CO)_2$), ethylcyclopentadienyl cobalt bis(carbonyl) ($EtCpCo(CO)_2$), pentamethylcyclopentadienyl cobalt bis(carbonyl) ($Me_5CpCo(CO)_2$), dicobalt octa(carbonyl) ($Co_2(CO)_8$), nitrosyl cobalt tris(carbonyl) ($(ON)Co(CO)_3$), bis(cyclopentadienyl) cobalt, (cyclopentadienyl) cobalt (cyclohexadienyl), cyclopentadienyl cobalt (1,3-hexadienyl), (cyclobutadienyl) cobalt (cyclopentadienyl), bis(methylcyclopentadienyl) cobalt, (cyclopentadienyl) cobalt (5-methylcyclopentadienyl), bis (ethylene) cobalt (pentamethylcyclopentadienyl), cobalt tetracarbonyl iodide, cobalt tetracarbonyl trichlorosilane, carbonyl chloride tris(trimethylphosphine) cobalt, cobalt tricarbonyl-hydrotributylphosphine, acetylene dicobalt hexacarbonyl, acetylene dicobalt pentacarbonyl triethylphosphine, derivatives thereof, complexes thereof, plasma thereof, or combinations thereof.

Nitrogen precursors may be used to deposit nitride or nitrogen-containing materials. Nitrogen precursors useful for depositing materials as described herein include ammonia ($NH_3$), hydrazine ($N_2H_4$), methyl hydrazine (($CH_3$)$HN_2H_2$), dimethyl hydrazine (($CH_3$)$_2N_2H_2$), t-butylhydrazine ($C_4H_9N_2H_3$), phenylhydrazine ($C_6H_5N_2H_3$), other hydrazine derivatives, amines, a nitrogen plasma source (e.g., $N_2$, atomic-N, $N_2/H_2$, $NH_3$, or a $N_2H_4$ plasma), 2,2'-azotertbutane (($CH_3$)$_6C_2N_2$), organic or alkyl azides, such as methylazide ($CH_3N_3$), ethylazide ($C_2H_5N_3$), trimethylsilylazide ($Me_3SiN_3$), inorganic azides (e.g., $NaN_3$ or $Cp_2CoN_3$) and other suitable nitrogen sources. Radical nitrogen compounds, such as $N_3$, $N_2$, N, NH, or $NH_2$, may be produced by heat, hot-wires, in situ plasma, or remote plasma. In one example, the nitrogen precursor is ammonia. In another example, the nitrogen precursor contains a nitrogen plasma formed in situ or by a remote plasma system.

Other reactive gases that may be used to deposit various materials, include tantalum nitride, tantalum-containing materials include oxygen sources and reductants. A tantalum-containing material, such as tantalum silicate, tantalum oxide, or tantalum oxynitride may be formed with the addition of an oxygen source to the vapor deposition (e.g., ALD or CVD) process. Oxygen sources or oxygen precursors include atomic-O, $O_2$, $O_3$, $H_2O$, $H_2O_2$, organic peroxides, derivatives thereof, or combinations thereof. Reducing compounds may be included in the vapor deposition process to form a tantalum precursor, such as metallic tantalum, tantalum boron nitride or tantalum phosphorous nitride. Reducing compounds include borane ($BH_3$), diborane ($B_2H_6$), alkylboranes (e.g., $Et_3B$), phosphine ($PH_3$), hydrogen ($H_2$), derivatives thereof, or combinations thereof.

A detailed description for a processing chamber, such as an ALD chamber, is described in commonly assigned U.S. Pat. No. 6,916,398, and U.S. Ser. No. 10/281,079, filed Oct. 25, 2002, and published as U.S. Pub. No. 2003-0121608, now abandoned, which are herein incorporated by reference in their entirety. In one embodiment, a plasma-enhanced ALD (PE-ALD) process is used to deposit tantalum materials. A chamber and process to perform PE-ALD is further described in commonly assigned U.S. Pat. No. 6,998,014, which is herein incorporated by reference in its entirety. A detailed description for a vaporizer or an ampoule to pre-heat precursors, such as PDMAT or TAIMATA, is described in commonly assigned U.S. Pat. Nos. 6,915,592 and 7,186,385, which are herein incorporated by reference in their entirety. A detailed description for a system to deliver the precursors, such as PDMAT or TAIMATA, to processing chamber is described in commonly assigned U.S. Pat. No. 6,955,211, and U.S. Ser. No. 10/700,328, filed Nov. 3, 2003, and published as U.S. Pub. No. 2005-0095859, now abandoned, which are herein incorporated by reference in their entirety.

Converge-Diverge Lid Assembly

Figure 3A:
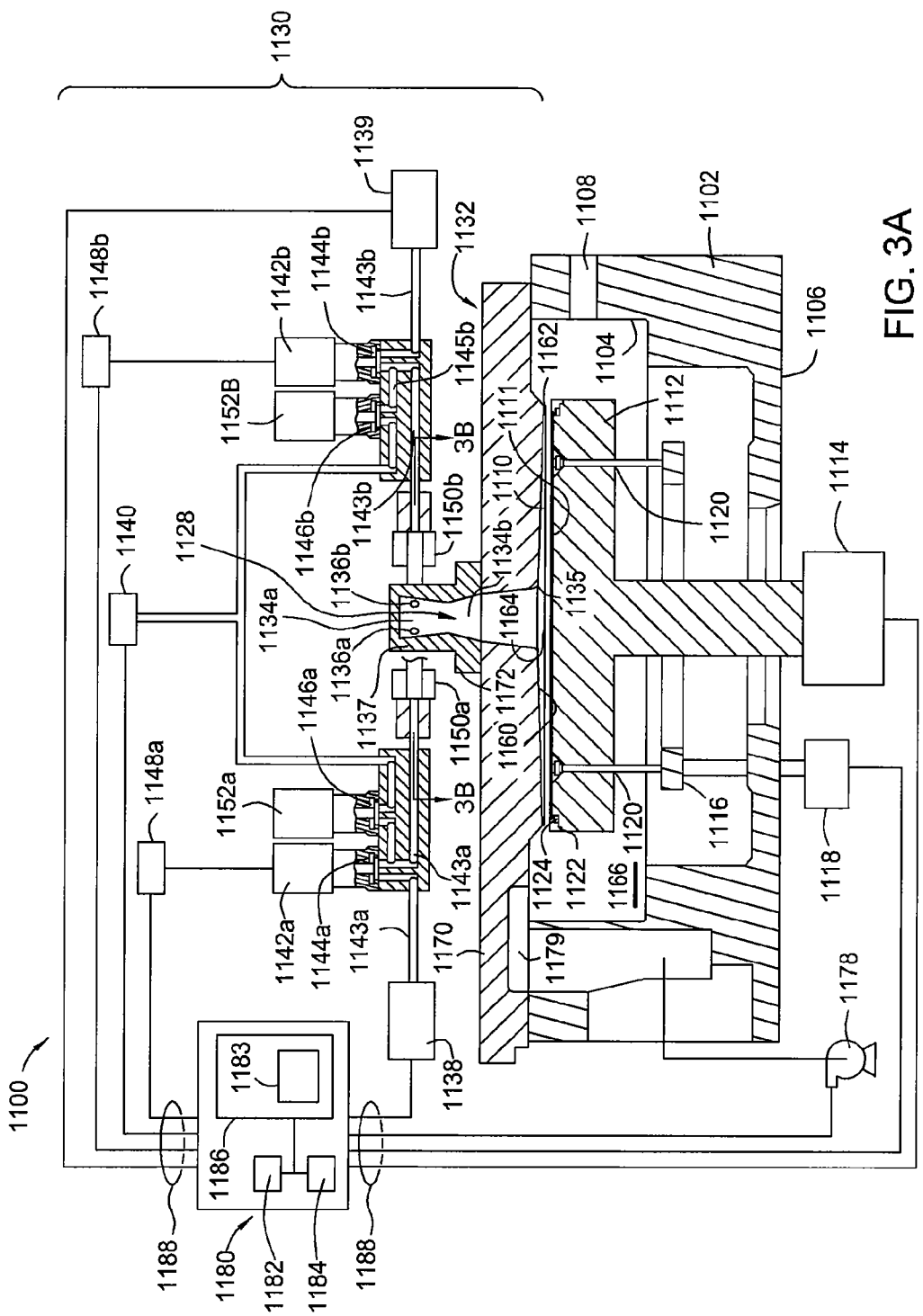

FIGS. 3A-3C are schematic views of processing chamber 1100 including gas delivery system 1130 adapted for ALD processes, as described in embodiments herein. Processing chamber 1100 contains a chamber body 1102 having sidewalls 1104 and bottom 1106. Slit valve 1108 in processing chamber 1100 provides access for a robot (not shown) to deliver and retrieve substrate 1110, such as a 200 mm or 300 mm semiconductor wafer or a glass substrate, to and from processing chamber 1100. A detailed disclosure of processing chambers that may be used with the pretreatment processes and the deposition processes described herein may be found in commonly assigned U.S. Pat. Nos. 6,916,398 and 7,204,886, and U.S. Ser. No. 11/923,583, filed Oct. 24, 2007, and published as U.S. Pub. No. 2008-0102208, now abandoned, which are herein incorporated by reference in their entirety.

Substrate support 1112 supports substrate 1110 on substrate receiving surface 1111 in processing chamber 1100. Substrate support 1112 is mounted to lift motor 1114 for raising and lowering substrate support 1112 and substrate 1110 disposed thereon. Lift plate 1116 connected to lift motor 1118 is mounted in processing chamber 1100 and raises and lowers lift pins 1120 movably disposed through substrate support 1112. Lift pins 1120 raise and lower substrate 1110 over the surface of substrate support 1112. Substrate support 1112 may include a vacuum chuck (not shown), an electrostatic chuck (not shown), or a clamp ring (not shown) for securing substrate 1110 to substrate support 1112 during a deposition process.

The temperature of substrate support 1112 may be adjusted to control the temperature of substrate 1110 disposed thereon. For example, substrate support 1112 may be heated using an embedded heating element, such as a resistive heater (not shown), or may be heated using radiant heat, such as heating lamps (not shown) disposed above substrate support 1112. Purge ring 1122 may be disposed on substrate support 1112 to define purge channel 1124 which provides a purge gas to a peripheral portion of substrate 1110 to prevent deposition thereon.

Gas delivery system 1130 is disposed at an upper portion of chamber body 1102 to provide a gas, such as a process gas and/or a purge gas, to processing chamber 1100. FIGS. 3A-3C depict gas delivery system 1130 configured to expose substrate 1110 to at least two gas sources or chemical precursors. In other examples, gas delivery system 1130 may be reconfigured to expose substrate 1110 to a single gas source or to three or more gas sources or chemical precursors. Vacuum system 1178 is in communication with pumping channel 1179 to evacuate any desired gases from processing chamber 1100 and to help maintain a desired pressure or a desired pressure range inside pumping zone 1166 of processing chamber 1100.

In one embodiment, gas delivery system 1130 contains chamber lid assembly 1132 having gas dispersing channel 1128 extending through a central portion of chamber lid assembly 1132. Gas dispersing channel 1128 extends perpendicular to substrate receiving surface 1111 and also extends along central axis 1133 of gas dispersing channel 1128, through lid plate 1170, and to lower surface 1160. Converging channel 1134a is a portion of gas dispersing channel 1128 that tapers towards central axis 1133 within upper portion 1137 of gas dispersing channel 1128. Diverging channel 1134b is a portion of gas dispersing channel 1128 that tapers away from central axis 1133 within lower portion 1135 of gas dispersing channel 1128. Throttle 1131 is a narrow passage separating converging channel 1134a and diverging channel 1134b. Gas dispersing channel 1128 further extends pass lower surface 1160 and into reaction zone 1164. Lower surface 1160 extends from diverging channel 1134 to choke 1162. Lower surface 1160 is sized and shaped to substantially cover substrate 1110 disposed on substrate receiving surface 1111 of substrate support 1112.

Processes gases, as circular gas flow 1174, are forced to make more revolutions around central axis 1133 of gas dispersing channel 1128 while passing through throttle 1131, than in similarly configured processing chamber in the absence of throttle 1131. Circular gas flow 1174 may contain a flow pattern, such as a vortex pattern, a helix pattern, a spiral pattern, a twirl pattern, a twist pattern, a coil pattern, a whirlpool pattern, or derivatives thereof. Circular gas flow 1174 may extend at least about 1 revolution around central axis 1133 of gas dispersing channel 1128, preferably, at least about 1.5 revolutions, more preferably, at least about 2 revolutions, more preferably, at least about 3 revolutions, and more preferably, about 4 revolutions or more.

Gas dispersing channel 1128 has gas inlets 1136a, 1136b to provide gas flows from two similar pairs of valves 1142a/1152a, 1142b/1152b, which may be provided together and/or separately. In one configuration, valve 1142a and valve 1142b are coupled to separate reactant gas sources but are preferably coupled to the same purge gas source. For example, valve 1142a is coupled to reactant gas source 1138 and valve 1142b is coupled to reactant gas source 1139, and both valves 1142a, 1142b are coupled to purge gas source 1140. Each valve 1142a, 1142b includes delivery line 1143a, 1143b having valve seat assembly 1144a, 1144b and each valve 1152a, 1152b includes purge line 1145a, 1145b having valve seat assembly 1146a, 1146b. Delivery line 1143a, 1143b is in fluid communication with reactant gas source 1138, 1143 and is in fluid communication with gas inlet 1136a, 1136b of gas dispersing channel 1128. Valve seat assembly 1144a, 1144b of the delivery line 1143a, 1143b controls the flow of the reactant gas from reactant gas source 1138, 1143 to gas dispersing channel 1128. Purge line 1145a, 1145b is in fluid communication with purge gas source 1140 and intersects delivery line 1143a, 1143b downstream of valve seat assembly 1144a, 1144b of delivery line 1143a, 1143b. Valve seat assembly 1146a, 1146b of purge line 1145a, 1145b controls the flow of the purge gas from purge gas source 1140 to gas dispersing channel 1128. If a carrier gas is used to deliver reactant gases from reactant gas source 1138, 1143, the same gas may be used as the carrier gas and the purge gas (e.g., argon used as a carrier gas and a purge gas).

Each valve seat assembly 1144a, 1144b, 1146a, 1146b may contain a diaphragm (not shown) and a valve seat (not shown). The diaphragm may be biased open or closed and may be actuated closed or open respectively. The diaphragms may be pneumatically actuated or may be electrically actuated. Pneumatically actuated valves include pneumatically actuated valves available from Fujikin, Inc. and Veriflo Division, Parker Hannifin, Corp. Electrically actuated valves include electrically actuated valves available from Fujikin, Inc. For example, an ALD valve that may be used is the Fujikin Model No. FPR-UDDFAT-21-6.35-PI-ASN or the Fujikin Model No. FPR-NHDT-21-6.35-PA-AYT. Programmable logic controllers 1148a, 1148b may be coupled to valves 1142a, 1142b to control actuation of the diaphragms of valve seat assemblies 1144a, 1144b, 1146a, 1146b of valves 1142a, 1142b. Pneumatically actuated valves may provide pulses of gases in time periods as low as about 0.020 seconds. Electrically actuated valves may provide pulses of gases in time periods as low as about 0.005 seconds. An electrically actuated valve typically requires the use of a driver coupled between the valve and the programmable logic controller.

Each valve 1142a, 1142b may be a zero dead volume valve to enable flushing of a reactant gas from delivery line 1143a, 1143b when valve seat assembly 1144a, 1144b is closed. For example, purge line 1145a, 1145b may be positioned adjacent valve seat assembly 1144a, 1144b of delivery line 1143a, 1143b. When valve seat assembly 1144a, 1144b is closed, purge line 1145a, 1145b may provide a purge gas to flush delivery line 1143a, 1143b. In one embodiment, purge line 1145a, 1145b is positioned slightly spaced from valve seat assembly 1144a, 1144b of delivery line 1143a, 1143b so that a purge gas is not directly delivered into valve seat assembly 1144a, 1144b when open. A zero dead volume valve as used herein is defined as a valve which has negligible dead volume (e.g., not necessary zero dead volume).

Each valve pair 1142a/1152a, 1142b/1152b may be adapted to provide a combined gas flow and/or separate gas flows of the reactant gas and the purge gas. In reference to valve pair 1142a/1152a, one example of a combined gas flow of the reactant gas and the purge gas includes a continuous flow of a purge gas from purge gas source 1140 through purge line 1145a and pulses of a reactant gas from reactant gas source 1138 through delivery line 1143a. The continuous flow of the purge gas may be provided by leaving the diaphragm of valve seat assembly 1146a of purge line 1145a open. The pulses of the reactant gas from reactant gas source 1138 may be provided by opening and closing the diaphragm of valve seat assembly 1144a of delivery line 1143a. In reference to valve pair 1142a/1152a, one example of separate gas flows of the reactant gas and the purge gas includes pulses of a purge gas from purge gas source 1140 through purge line 1145a and pulses of a reactant gas from reactant gas source 1138 through delivery line 1143a. The pulses of the purge gas may be provided by opening and closing the diaphragm of valve seat assembly 1146a of purge line 1145a. The pulses of the reactant gas from reactant gas source 1138 may be provided by opening and closing the diaphragm of valve seat assembly 1144a of delivery line 1143a.

Delivery lines 1143a, 1143b of valves 1142a, 1142b may be coupled to gas inlets 1136a, 1136b through gas conduits 1150a, 1150b. Gas conduits 1150a, 1150b may be integrated or may be separate from valves 1142a, 1142b. In one aspect, valves 1142a, 1142b are coupled in close proximity to gas dispersing channel 1128 to reduce any unnecessary volume of delivery line 1143a, 1143b and gas conduits 1150a, 1150b between valves 1142a, 1142b and gas inlets 1136a, 1136b.

FIG. 3C depicts each gas conduit 1150a and 1150b and gas inlet 1136a and 1136b positioned in a variety of angles in relationship to central axis 1133 of gas dispersing channel 1128. Each gas conduit 1150a, 1150b and gas inlet 1136a, 1136b are preferably positioned normal (in which $+\beta$, $-\beta=90°$) to central axis 1133 or positioned at an angle $+\beta$ or an angle $-\beta$ (in which $0°<+\beta<90°$ or $0°<-\beta<90°$) from center lines 1176a and 1176b of gas conduit 1150a, 1150b to central axis 1133. Therefore, gas conduit 1150a, 1150b may be positioned horizontally normal to central axis 1133 and, may be angled downwardly at an angle $+\beta$, or may be angled upwardly at an angle $-\beta$ to provide a gas flow towards the walls of gas dispersing channel 1128 rather than directly downward towards substrate 1110 which helps reduce the likelihood of blowing off reactants adsorbed on the surface of substrate 1110. In addition, the diameter of gas conduits 1150a, 1150b may be increasing from delivery lines 1143a, 1143b of valves 1142a, 1142b to gas inlet 1136a, 1136b to help reduce the velocity of the gas flow prior to its entry into gas dispersing channel 1128. For example, gas conduits 1150a, 1150b may contain an inner diameter which is gradually increasing or may contain a plurality of connected conduits having increasing inner diameters.

FIG. 3C depicts gas dispersing channel 1128 containing an inner diameter which decreases within converging channel 1134a from upper portion 1137, along central axis 1133, to throttle 1131. Also, gas dispersing channel 1128 contains an inner diameter which increases within diverging channel 1134b from throttle 1131, along central axis 1133, to lower portion 1135 adjacent lower surface 1160 of chamber lid assembly 1132. In one example, processing chamber 1100 adapted to process 100 mm diameter substrates may have the following diameters. The diameter at upper portion 1137 of gas dispersing channel 1128 may be within a range from about 0.5 inches to about 2 inches, preferably, from about 0.75 inches to about 1.5 inches, and more preferably, from 0.8 inches to about 1.2 inches, for example, about 1 inch. The diameter at throttle 1131 of gas dispersing channel 1128 may be within a range from about 0.1 inches to about 1.5 inches, preferably, from about 0.3 inches to about 0.9 inches, and more preferably, from 0.5 inches to about 0.8 inches, for example, about 0.66 inches. The diameter at lower portion 1135 of gas dispersing channel 1128 may be within a range from about 0.5 inches to about 2 inches, preferably, from about 0.75 inches to about 1.5 inches, and more preferably, from 0.8 inches to about 1.2 inches, for example, about 1 inch.

In general, the above dimension apply to gas dispersing channel 1128 adapted to provide a total gas flow rate within a range from about 500 sccm to about 20 slm. In other specific embodiments, the dimension may be altered to accommodate a certain gas flow therethrough. In general, a larger gas flow will require a larger diameter of gas dispersing channel 1128.

Not wishing to be bound by theory, it is believed that the diameter of gas dispersing channel 1128, which is gradually decreasing from upper portion 1137 of gas dispersing channel 1128 to throttle 1131 and increasing from throttle 1131 to lower portion 1135 of gas dispersing channel 1128, allows less of an adiabatic expansion of a gas through gas dispersing channel 1128 which helps to control the temperature of the process gas contained in circular flow gas 1174. For instance, a sudden adiabatic expansion of a gas delivered through gas inlet 1136a, 1136b into gas dispersing channel 1128 may result in a drop in the temperature of the gas which may cause condensation of the gas and formation of droplets. On the other hand, gas dispersing channel 1128 that gradually tapers is believed to provide less of an adiabatic expansion of a gas. Therefore, more heat may be transferred to or from the gas, and, thus, the temperature of the gas may be more easily controlled by controlling the surrounding temperature of the gas (e.g., controlling the temperature of chamber lid assembly 1132). Gas dispersing channel 1128 may gradually taper and contain one or more tapered inner surfaces, such as a tapered straight surface, a concave surface, a convex surface, or combinations thereof or may contain sections of one or more tapered inner surfaces (e.g., a portion tapered and a portion non-tapered).

In one embodiment, gas inlets 1136a, 1136b are located adjacent upper portion 1137 of gas dispersing channel 1128. In other embodiments, one or more gas inlets 1136a, 1136b may be located along the length of gas dispersing channel 1128 between upper portion 1137 and lower portion 1135.

Each gas conduit 1150a, 1150b may be positioned at an angle a from the centerline of the gas conduit 1150a, 1150b and from a radius line of gas dispersing channel 1128, similarly as depicted in FIG. 3C of each gas conduits 1150a and 1150b that may be positioned at an angle a from center lines 1146a and 1146b of gas conduits 1150a and 1150b and from radius line from the center of gas dispersing channel 1128. Entry of a gas through gas conduit 1150a, 1150b preferably positioned at an angle a (e.g., when $\alpha > 0°$) causes the gas to flow in a circular direction as shown by circular gas flow 1174 (FIGS. 3B-3C). Providing gas at an angle a as opposed to directly straight-on to the walls of the expanding channel (e.g., when $\alpha = 0°$) helps to provide a more laminar flow through gas dispersing channel 1128 rather than a turbulent flow. It is believed that a laminar flow through gas dispersing channel 1128 results in an improved purging of the inner surface of gas dispersing channel 1128 and other surfaces of chamber lid assembly 1132. In comparison, a turbulent flow may not uniformly flow across the inner surface of gas dispersing channel 1128 and other surfaces and may contain dead spots or stagnant spots in which there is no gas flow. In one aspect, gas conduits 1150a, 1150b and corresponding gas inlets 1136a, 1136b are spaced out from each other and direct a flow in the same circular direction (e.g., clockwise or counter-clockwise).

Not wishing to be bound by theory, FIG. 3C is a cross-sectional view of gas dispersing channel 1128 of chamber lid assembly 1132 showing simplified representations of gas flows therethrough. Although the exact flow pattern through the gas dispersing channel 1128 is not known, it is believed that circular gas flow 1174 (FIGS. 3B-3C) may travel through gas dispersing channel 1128 with a circular flow pattern, such as a vortex flow, a helix flow, a spiral flow, a swirl flow, a twirl flow, a twist flow, a coil flow, a corkscrew flow, a curl flow, a whirlpool flow, derivatives thereof, or combinations thereof. As shown in FIG. 3C, the circular flow may be provided in a "processing region" as opposed to in a compartment separated from substrate 1110. In one aspect, circular gas flow 1174 may help to establish a more efficient purge of gas dispersing channel 1128 due to the sweeping action of the vortex flow pattern across the inner surface of gas dispersing channel 1128.

In one embodiment, FIG. 3C depicts distance 1175 between gas inlets 1136a, 1136b and substrate 1110 long enough that circular gas flow 1174 dissipates to a downwardly flow as a spiral flow across the surface of substrate 1110 may not be desirable. It is believed that circular gas flow 1174 proceeds in a laminar manner efficiently purging the surface of chamber lid assembly 1132 and substrate 1110. In one specific embodiment, the length of distance 1175 between upper portion 1137 of gas dispersing channel 1128 and substrate 1110 may be within a range from about 3 inches to about 8 inches, preferably, from about 3.5 inches to about 7 inches, and more preferably, from about 4 inches to about 6 inches, such as about 5 inches.

Distance 1177a as the length of converging channel 1134a along central axis 1133 within lid cap 1172 between upper portion 1137 of gas dispersing channel 1128 and throttle 1131 and distance 1177b as the length of diverging channel 1134b along central axis 1133 within lid cap 1172 between throttle 1131 and lower surface 1173 of lid cap 1172. In one example, distance 1177a may have a length within a range from about 1 inch to about 4 inches, preferably, from about 1.25 inches to about 3 inches, and more preferably, from about 1.5 inches to about 2.5 inches, for example, about 2 inches and distance 1177b may have a length within a range from about 0.5 inches to about 4 inches, preferably, from about 1 inch to about 3 inches, and more preferably, from about 1.25 inches to about 1.75 inches, for example, about 1.5 inches.

FIG. 3A depicts that at least a portion of lower surface 1160 of chamber lid assembly 1132 may be tapered from gas dispersing channel 1128 to a peripheral portion of chamber lid assembly 1132 to help provide an improved velocity profile of a gas flow from gas dispersing channel 1128 across the surface of substrate 1110 (e.g., from the center of the substrate to the edge of the substrate). Lower surface 1160 may contain one or more tapered surfaces, such as a straight surface, a concave surface, a convex surface, or combinations thereof. In one embodiment, lower surface 1160 is tapered in the shape of a funnel.

In one example, lower surface 1160 is downwardly sloping to help reduce the variation in the velocity of the process gases traveling between lower surface 1160 of chamber lid assembly 1132 and substrate 1110 while assisting to provide uniform exposure of the surface of substrate 1110 to a reactant gas. In one embodiment, the ratio of the maximum area of the flow section over the minimum area of the flow section between a downwardly sloping lower surface 1160 of chamber lid assembly 1132 and the surface of substrate 1110 is less than about 2, preferably, less than about 1.5, more preferably, less than about 1.3, and more preferably, about 1.

Not wishing to be bound by theory, it is believed that a gas flow traveling at a more uniform velocity across the surface of substrate 1110 helps provide a more uniform deposition of the gas on substrate 1110. It is believed that the velocity of the gas is directly proportional to the concentration of the gas which is in turn directly proportional to the deposition rate of the gas on substrate 1110 surface. Thus, a higher velocity of a gas at a first area of the surface of substrate 1110 versus a second area of the surface of substrate 1110 is believed to provide a higher deposition of the gas on the first area. It is believed that chamber lid assembly 1132 having lower surface 1160, downwardly sloping, provides for more uniform deposition of the gas across the surface of substrate 1110 because lower surface 1160 provides a more uniform velocity and, thus, a more uniform concentration of the gas across the surface of substrate 1110.

FIG. 3A depicts choke 1162 located at a peripheral portion of chamber lid assembly 1132 adjacent the periphery of substrate 1110. Choke 1162, when chamber lid assembly 1132 is assembled to form a processing zone around substrate 1110, contains any member restricting the flow of gas therethrough at an area adjacent the periphery of substrate 1110.

In one specific embodiment, the spacing between choke 1162 and substrate support 1112 may be within a range from about 0.04 inches to about 2.0 inches, and preferably, from about 0.04 inches to about 0.2 inches. The spacing may vary depending on the gases being delivered and the process conditions during deposition. Choke 1162 helps provide a more uniform pressure distribution within the volume or reaction zone 1164 defined between chamber lid assembly 1132 and substrate 1110 by isolating reaction zone 1164 from the non-uniform pressure distribution of pumping zone 1166 (FIG. 3A).

Referring to FIG. 3A, in one aspect, since reaction zone 1164 is isolated from pumping zone 1166, a reactant gas or purge gas needs only adequately fill reaction zone 1164 to ensure sufficient exposure of substrate 1110 to the reactant gas or purge gas. In conventional CVD, prior art chambers are required to provide a combined flow of reactants simultaneously and uniformly to the entire surface of the substrate in order to ensure that the co-reaction of the reactants occurs uniformly across the surface of substrate 1110. In ALD, processing chamber 1100 sequentially introduces reactants to the surface of substrate 1110 to provide absorption of alternating thin layers of the reactants onto the surface of substrate 1110. As a consequence, ALD does not require a flow of a reactant which reaches the surface of substrate 1110 simultaneously. Instead, a flow of a reactant needs to be provided in an amount which is sufficient to adsorb a thin layer of the reactant on the surface of substrate 1110.

Since reaction zone 1164 may contain a smaller volume when compared to the inner volume of a conventional CVD chamber, a smaller amount of gas is required to fill reaction zone 1164 for a particular process in an ALD sequence, as described in one embodiment herein. For example, the volume of reaction zone 1164 may be about 1,000 cm$^3$ or less, preferably, about 500 cm$^3$ or less, and more preferably, about 200 cm$^3$ or less for a chamber adapted to process 200 mm diameter substrates. In another example, the volume of reaction zone 1164 may be about 3,000 cm$^3$ or less, preferably, about 1,500 cm$^3$ or less, and more preferably, about 600 cm$^3$ or less for a chamber adapted to process 100 mm diameter substrates. In another embodiment, substrate support 1112 may be raised or lowered to adjust the volume of reaction zone 1164 for deposition. Because of the smaller volume of reaction zone 1164, less gas, whether a deposition gas or a purge gas, is necessary to be flowed into processing chamber 1100. Therefore, the throughput of processing chamber 1100 is greater and the waste may be minimized due to the smaller amount of gas used reducing the cost of operation.

Chamber lid assembly 1132 contains lid cap 1172 and lid plate 1170 in which lid cap 1172 and lid plate 1170 form gas dispersing channel 1128, as depicted in FIGS. 3A-3C. An additional plate may be optionally disposed between lid plate 1170 and lid cap 1172. In other embodiments, gas dispersing channel 1128 may be made integrally from a single piece of material.

Chamber lid assembly 1132 may include cooling elements and/or heating elements depending on the particular gas being delivered therethrough. Controlling the temperature of chamber lid assembly 1132 may be used to prevent gas decomposition, deposition, or condensation on chamber lid assembly 1132. For example, water channels (such as a coolant channel (not shown)) may be formed in chamber lid assembly 1132 to cool chamber lid assembly 1132. In another example, heating elements (not shown) may be embedded or may surround components of chamber lid assembly 1132 to heat chamber lid assembly 1132. In one embodiment, components of chamber lid assembly 1132 may be individually heated or cooled. For example, referring to FIG. 3A, chamber lid assembly 1132 may contain lid plate 1170 and lid cap 1172 in which lid plate 1170 and lid cap 1172 form gas dispersing channel 1128. Lid cap 1172 may be maintained at one temperature range and lid plate 1170 may be maintained at another temperature range. For example, lid cap 1172 may be heated by being wrapped in heater tape or by using another heating device to prevent condensation of reactant gases and lid plate 1170 may be maintained at ambient temperature. In another example, lid cap 1172 may be heated and lid plate 1170 may be cooled with water channels formed therethrough to prevent thermal decomposition of reactant gases on lid plate 1170.

The components and parts of chamber lid assembly 1132 may contain materials such as stainless steel, aluminum, nickel-plated aluminum, nickel, alloys thereof, or other suitable materials. In one embodiment, lid cap 1172 and lid plate 1170 may be independently fabricated, machined, forged, or otherwise made from a metal, such as aluminum, an aluminum alloy, steel, stainless steel, alloys thereof, or combinations thereof.

In one embodiment, the inner surfaces of gas dispersing channel 1128 (including both inner surfaces of lid plate 1170 and lid cap 1172) and lower surface 1160 of chamber lid assembly 1132 may contain a mirror polished surface to help produce a laminar flow of a gas along gas dispersing channel 1128 and lower surface 1160 of chamber lid assembly 1132. In another embodiment, the inner surface of gas conduits 1150a, 1150b may be electropolished to help produce a laminar flow of a gas therethrough.

In an alternative embodiment, the inner surfaces of gas dispersing channel 1128 (including both inner surfaces of lid plate 1170 and lid cap 1172) and lower surface 1160 of chamber lid assembly 1132 may contain a roughened surface or machined surfaces to produce more surface area across the surfaces. Roughened surfaces provide better adhesion of undesired accumulated materials on the inner surfaces of lid plate 1170 and lid cap 1172 and lower surface 1160. The undesired films are usually formed as a consequence of conducting a vapor deposition process and may peel or flake from lower surface 1160 and the inner surfaces of gas dispersing channel 1128 to contaminate substrate 1110. In one example, the mean roughness ($R_a$) of lower surface 1160 and/or the inner surfaces of gas dispersing channel 1128 may be at least about 10 μm, such as within a range from about 10 μin (about 0.254 μm) to about 200 μin (about 5.08 μm), preferably, from about 20 μin (about 0.508 μm) to about 100 μin (about 2.54 μm), and more preferably, from about 30 μin (about 0.762 μm) to about 80 μin (about 2.032 μm). In another example, the mean roughness of lower surface 1160 and/or the inner surfaces of gas dispersing channel 1128 may be at least about 100 μin (about 2.54 μm), preferably, within a range from about 200 μin (about 5.08 μm) to about 500 μin (about 12.7 μm).

FIG. 3A depicts control unit 1180, such as a programmed personal computer, work station computer, or the like, coupled to processing chamber 1100 to control processing conditions. For example, control unit 1180 may be configured to control flow of various process gases and purge gases from gas sources 1138, 1143, and 1140 through valves 1142a and 1142b during different stages of a substrate process sequence. Illustratively, control unit 1180 contains central processing unit (CPU) 1182, support circuitry 1184, and memory 1186 containing associated control software 1183.

Control unit 1180 may be one of any form of general purpose computer processor that can be used in an industrial setting for controlling various chambers and sub-processors. CPU 1182 may use any suitable memory 1186, such as random access memory, read only memory, floppy disk drive, hard disk, or any other form of digital storage, local or remote. Various support circuits may be coupled to CPU 1182 for supporting processing chamber 1100. Control unit 1180 may be coupled to another controller that is located adjacent individual chamber components, such as programmable logic controllers 1148a, 1148b of valves 1142a, 1142b. Bi-directional communications between the control unit 1180 and various other components of processing chamber 1100 are handled through numerous signal cables collectively referred to as signal buses 1188, some of which are illustrated in FIG. 3A. In addition to control of process gases and purge gases from gas sources 1138, 1143, 1140 and from programmable logic controllers 1148a, 1148b of valves 1142a, 1142b, control unit 1180 may be configured to be responsible for automated control of other activities used in wafer processing-such as wafer transport, temperature control, chamber evacuation, among other activities, some of which are described elsewhere herein.

Referring to FIGS. 3A-3C, in operation, substrate 1110 is delivered to processing chamber 1100 through slit valve 1108 by a robot (not shown). Substrate 1110 is positioned on substrate support 1112 through cooperation of lift pins 1120 and the robot. Substrate support 1112 raises substrate 1110 into close opposition to lower surface 1160 of chamber lid assembly 1132. A first gas flow may be injected into gas dispersing channel 1128 of processing chamber 1100 by valve 1142a together or separately with a second gas flow injected into processing chamber 1100 by valve 1142b. The first gas flow may contain a continuous flow of a purge gas from purge gas source 1140 and pulses of a reactant gas from reactant gas source 1138 or may contain pulses of a reactant gas from reactant gas source 1138 and pulses of a purge gas from purge gas source 1140. The second gas flow may contain a continuous flow of a purge gas from purge gas source 1140 and pulses of a reactant gas from reactant gas source 1139 or may contain pulses of a reactant gas from reactant gas source 1139 and pulses of a purge gas from purge gas source 1140. Circular gas flow 1174 travels through gas dispersing channel 1128 as a vortex flow which provides a sweeping action across the inner surface of gas dispersing channel 1128. Circular gas flow 1174 dissipates to a downwardly flow towards the surface of substrate 1110. The velocity of the gas flow reduces as it travels through gas dispersing channel 1128. The gas flow then travels across the surface of substrate 1110 and across lower surface 1160 of chamber lid assembly 1132. Lower surface 1160 of chamber lid assembly 1132, which is downwardly sloping, helps reduce the variation of the velocity of the gas flow across the surface of substrate 1110. The gas flow then travels by choke 1162 and into pumping zone 1166 of processing chamber 1100. Excess gas, by-products, etc. flow into the pumping channel 1179 and are then exhausted from processing chamber 1100 by vacuum system 1178. In one aspect, the gas flow proceeds through gas dispersing channel 1128 and between the surface of substrate 1110 and lower surface 1160 of chamber lid assembly 1132 in a laminar manner which aids in uniform exposure of a reactant gas to the surface of substrate 1110 and efficient purging of inner surfaces of chamber lid assembly 1132.

Processing chamber 1100, as illustrated in FIGS. 3A-3C, has been described herein as having a combination of features. In one aspect, processing chamber 1100 provides reaction zone 1164 containing a small volume in compared to a conventional CVD chamber. Processing chamber 1100 requires a smaller amount of a gas, such as a reactant gas or a purge gas, to fill reaction zone 1164 for a particular process. In another aspect, processing chamber 1100 provides chamber lid assembly 1132 having a downwardly sloping or funnel shaped lower surface 1160 to reduce the variation in the velocity profile of a gas flow traveling between the bottom surface of chamber lid assembly 1132 and substrate 1110. In still another aspect, processing chamber 1100 provides gas dispersing channel 1128 to reduce the velocity of a gas flow introduced therethrough. In still another aspect, processing chamber 1100 provides gas conduits at an angle a from the center of gas dispersing channel 1128. Processing chamber 1100 provides other features as described elsewhere herein. Other embodiments of a chamber adapted for ALD incorporate one or more of these features.

Embodiments of the invention provide chamber pretreatment and deposition processes that may be used to deposit materials during a vapor deposition process, such as an ALD process. The processes may be used within a variety of vapor deposition processing chambers and gas delivery systems which contain an expanding channel lid assembly, a converge-diverge lid assembly, a multiple injection lid assembly, or an extended cap lid assembly. Other embodiments provide methods for depositing materials using these gas delivery systems during ALD processes.

Processing chamber 1100, as depicted in FIGS. 3A-3C, may be used advantageously to implement ALD or CVD processes as described by embodiments herein. For clarity reasons, deposition of a layer by ALD will be described in more detail in reference to the ALD of a tantalum nitride layer utilizing processing chamber 1100. In one aspect, ALD of a tantalum nitride barrier layer includes sequentially providing pulses of a tantalum precursor and pulses of a nitrogen precursor to processing chamber 1100 in which each pulse is separated by a flow of a purge gas and/or chamber evacuation to remove any excess reactants to prevent gas phase reactions of the tantalum precursor with the nitrogen precursor and to remove any reaction by-products. Sequentially providing a tantalum precursor and a nitrogen precursor may result in the alternating absorption of monolayers of a tantalum precursor and of monolayers of a nitrogen precursor to form a monolayer of tantalum nitride on a substrate structure for each cycle of pulses. The term substrate structure is used to refer to the substrate as well as other material layers formed thereover, such as a dielectric layer.

It is believed that the adsorption processes used to adsorb the monolayer of the reactants, such as the tantalum precursor and the nitrogen precursor, are self-limiting in that only one monolayer may be adsorbed onto the surface of the substrate structure during a given pulse because the surface of the substrate structure has a finite number of sites for adsorbing the reactants. Once the finite number of sites is occupied by the reactants, such as the tantalum precursor or the nitrogen precursor, further absorption of the reactants will be blocked. The cycle may be repeated to a desired thickness of the tantalum nitride layer.

Embodiments of the invention provide a pretreatment process for exposing the inner surfaces of processing chamber 1100 to a hydrogenated ligand compound within a treatment gas. In one embodiment, the treatment gas may be delivered into processing chamber 1100 from any one of gas sources 1138, 1139, and/or 140. Alternatively, in another embodiment, the treatment gas may be delivered into processing chamber 1100 from another gas source (not shown). In another embodiment, treatment gas containing the hydrogenated ligand compound may enter processing chamber 1100 through an inlet on lid cap 1172 (not shown). Upon entering the processing chamber 1100, the treatment gas may travel down gas dispersing channel 1128, from converging channel 1134a, through diverging channel 1134b, along lower surface 1160, and into reaction zone 1164. The inner surfaces of processing chamber 1100, including the surfaces of converging channel 1134a, diverging channel 1134b, lower surface 1160, and reaction zone 1164, may be coated with the hydrogenated ligand compound or other reagent from the treatment gas.

In another embodiment, the treatment gas containing the hydrogenated ligand compound or other reagent, flows in revolutions around central axis 1133 of gas dispersing channel 1128, as circular gas flow 1174, while coating the inner surfaces of processing chamber 1100, as depicted in FIG. 3C. Circular gas flow 1174 may contain a flow pattern, such as a vortex pattern, a helix pattern, a spiral pattern, a twirl pattern, a twist pattern, a coil pattern, a whirlpool pattern, or derivatives thereof. Circular gas flow 1174 may extend at least about 1 revolution around central axis 1133 of gas dispersing channel 1128, preferably, at least about 1.5 revolutions, more preferably, at least about 2 revolutions, more preferably, at least about 3 revolutions, and more preferably, about 4 revolutions or more.

Pulses of a tantalum precursor, such as PDMAT, may be introduced by gas source 1138 through valve 1142a. The tantalum precursor may be provided with the aid of a carrier gas, which includes, but is not limited to, helium, argon, nitrogen (N2), hydrogen (H2), or mixtures thereof. Pulses of a nitrogen precursor, such as ammonia, may be introduced by gas source 1139 through valve 1142a. A carrier gas may also be used to help deliver the nitrogen precursor. A purge gas, such as argon, may be introduced by gas source 1140 through valve 1142a and/or through valve 1142b. In one aspect, the flow of purge gas may be continuously provided by gas source 1140 through valves 1142a, 1142b to act as a purge gas between the pulses of the tantalum precursor and of the nitrogen precursor and to act as a carrier gas during the pulses of the tantalum precursor and the nitrogen precursor. In one aspect, delivering a purge gas through two gas conduits 1150a, 1150b provides a more complete purge of reaction zone 1164 rather than a purge gas provided through one of gas conduit 1150a or 1150b. In one aspect, a reactant gas may be delivered through one of gas conduits 1150a or 1150b since uniformity of flow of a reactant gas, such as a tantalum precursor or a nitrogen precursor, is not as critical as uniformity of the purge gas due to the self-limiting absorption process of the reactants on the surface of substrate structures. In other embodiments, a purge gas may be provided in pulses. In other embodiments, a purge gas may be provided in more or less than two gas flows. In other embodiments, a tantalum precursor gas may be provided in more than a single gas flow (e.g., two or more gas flows). In other embodiments, a nitrogen precursor gas may be provided in more than a single gas flow (e.g., two or more gas flows).

The tantalum nitride layer formation is described as starting with the absorption of a monolayer of a tantalum precursor on the substrate followed by a monolayer of a nitrogen precursor. Alternatively, the tantalum nitride layer formation may start with the absorption of a monolayer of a nitrogen precursor on the substrate followed by a monolayer of the tantalum precursor. Furthermore, in other embodiments, a pump evacuation alone between pulses of reactant gases may be used to prevent mixing of the reactant gases.

The time duration for each pulse of the tantalum precursor, the time duration for each pulse of the nitrogen precursor, and the duration of the purge gas flow between pulses of the reactants are variable and depend on the volume capacity of a deposition chamber employed as well as a vacuum system coupled thereto. For example, (1) a lower chamber pressure of a gas will require a longer pulse time; (2) a lower gas flow rate will require a longer time for chamber pressure to rise and stabilize requiring a longer pulse time; and (3) a large-volume chamber will take longer to fill, longer for chamber pressure to stabilize thus requiring a longer pulse time. Similarly, time between each pulse is also variable and depends on volume capacity of the processing chamber as well as the vacuum system coupled thereto. In general, the time duration of a pulse of the tantalum precursor or the nitrogen precursor should be long enough for absorption of a monolayer of the compound. In one aspect, a pulse of a tantalum precursor may still be in the chamber when a pulse of a nitrogen precursor enters. In general, the duration of the purge gas and/or pump evacuation should be long enough to prevent the pulses of the tantalum precursor and the nitrogen precursor from mixing together in the reaction zone.

Generally, a pulse time of about 1.0 second or less for a tantalum precursor and a pulse time of about 1.0 second or less for a nitrogen precursor are typically sufficient to adsorb alternating monolayers on a substrate structure. A time of about 1.0 second or less between pulses of the tantalum precursor and the nitrogen precursor is typically sufficient for the purge gas, whether a continuous purge gas or a pulse of a purge gas, to prevent the pulses of the tantalum precursor and the nitrogen precursor from mixing together in the reaction zone. Of course, a longer pulse time of the reactants may be used to ensure absorption of the tantalum precursor and the nitrogen precursor and a longer time between pulses of the reactants may be used to ensure removal of the reaction by-products.

In one example, a processing chamber, a substrate, or a substrate support may be maintained approximately below a thermal decomposition temperature of a selected tantalum precursor during an ALD process. An exemplary heater temperature range to be used with tantalum precursors identified herein is approximately between about 20° C. and about 500° C. at a chamber pressure less than about 100 Torr, preferably less than 50 Torr. When the tantalum precursor is PDMAT, the heater temperature is preferably within a range from about 150° C. to about 350° C., more preferably, from about 250° C. and 300° C., and the internal pressure of the processing chamber may be within a range from about 5 Torr to about 20 Torr. In other embodiments, it should be understood that other temperatures and pressures may be used. For example, a temperature above a thermal decomposition temperature may be used. However, the temperature should be selected so that more than 50 percent of the deposition activity is by absorption processes. In another example, a temperature above a thermal decomposition temperature may be used in which the amount of decomposition during each precursor deposition is limited so that the growth mode will be similar to an ALD growth mode.

In one example, processing chamber 1100 may be exposed to a pretreatment process and subsequently, to an ALD process. The process may provide pulses of the tantalum precursor gas (e.g., PDMAT in argon) from gas source 1138 at a flow rate within a range from about 100 sccm to about 1,000 sccm, preferably, from about 300 sccm to about 700 sccm, through valve 1142a having a pulse time of about 1 second or less. The process may further provide pulses of the nitrogen precursor gas (e.g., ammonia) may be provided from gas source 1139 at a flow rate within a range from about 20 sccm and about 1,000 sccm, preferably, from about 100 sccm to about 300 sccm, through valve 1142b having a pulse time of about 1 second or less. An argon purge gas may have a flow rate within a range from about 1 slm to about 12 slm, preferably, from about 2 slm to about 8 slm, and may be continuously provided from gas source 1140 through valves 1142a, 1142b, as well as through other inlets on processing chamber 1100. The time between pulses of the tantalum precursor and the nitrogen precursor may be about 0.5 seconds or less.

In one embodiment, a tantalum nitride layer may be deposited to a sidewall of a via or a similar aperture with a thickness of about 50 Å or less, preferably, about 20 Å or less, and more preferably, about 10 Å or less. A tantalum nitride layer with a thickness of about 10 Å or less is believed to be a sufficient thickness in the application as a barrier layer to prevent copper diffusion. In other embodiments, the tantalum nitride layer may have a thickness greater than 50 Å. In one aspect, a thin barrier layer containing tantalum nitride deposited by the processes described herein may be used in filling submicron (e.g., less than 0.15 µm) and smaller features having high aspect ratios (e.g., greater than 5 to 1).

The treatment of the interior surfaces of the processing chamber during the pretreatment process helps to increase the uniformity (or decrease the non-uniformity) across the substrate surface of the tantalum nitride layer or other deposited material—as opposed to not conducting the pretreatment process. The non-uniformity of the deposited material across the substrate surface may be about 12% or less, preferably, about 10% or less, and more preferably, about 8% or less, for example, about 6% or less.

"Atomic layer deposition" (ALD), as used herein, refers to the sequential introduction of two or more reactive compounds to deposit a layer of material on a substrate surface. The two, three, or more reactive compounds may alternatively be introduced into a reaction zone or process region of a processing chamber. The reactive compounds may be in a state of gas, plasma, vapor, fluid or other state of matter useful for a vapor deposition process. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. Compound A and compound B react to form a deposited material. During each time delay a purge gas is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film thickness of the deposited material is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness. In an alternative embodiment, a first precursor containing compound A, a second precursor containing compound B and a third precursor containing compound C are each separately pulsed into the processing chamber. Alternatively, a pulse of a first precursor may overlap in time with a pulse of a second precursor while a pulse of a third precursor does not overlap in time with either pulse of the first and second precursors. "Process gas" as used herein refers to a single gas, multiple gases, a gas containing a plasma, combinations of gas(es) and/or plasma(s). A process gas may contain at least one reactive compound for a vapor deposition process. The reactive compounds may be in a state of gas, plasma, vapor, fluid, or other state of matter useful for a vapor deposition process. Also, a process gas may contain a purge gas or a carrier gas and not contain a reactive compound.

"Substrate" or "substrate surface," as used herein, refers to any substrate or material surface formed on a substrate upon which film processing is performed. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, quartz, and any other materials such as metals, metal nitrides, metal alloys, and other conductive materials, depending on the application. Barrier layers, metals or metal nitrides on a substrate surface may include titanium, titanium nitride, titanium silicide nitride, tungsten, tungsten nitride, tungsten suicide nitride, tantalum, tantalum nitride, or tantalum silicide nitride. Substrates may have various dimensions, such as 200 mm or 300 mm diameter wafers, as well as, rectangular or square panes. Substrates include semiconductor substrates, display substrates (e.g., LCD), solar panel substrates, and other types of substrates. Unless otherwise noted, embodiments and examples described herein are preferably conducted on substrates with a 200 mm diameter or a 300 mm diameter, more preferably, a 300 mm diameter. Substrates on which embodiments of the invention may be useful include, but are not limited to semiconductor wafers, such as crystalline silicon (e.g., Si<100> or Si<111>), silicon oxide, glass, quartz, strained silicon, silicon germanium, doped or undoped polysilicon, doped or undoped silicon wafers and patterned or non-patterned wafers. Substrates may be exposed to a pretreatment process to polish, etch, reduce, oxidize, hydroxylate, anneal, and/or heat the substrate surface.

Although the invention has been described in terms of specific embodiments, one skilled in the art will recognize that various changes to the reaction conditions, e.g., temperature, pressure, film thickness and the like can be substituted and are meant to be included herein and sequence of gases being deposited. For example, sequential deposition process may have different initial sequence. The initial sequence may include exposing the substrate to the nitrogen-containing gas before the tantalum-containing gas is introduced into the processing chamber. In addition, the tantalum nitride layer may be employed for other features of circuits in addition to functioning as a diffusion barrier for contacts. Therefore, the scope of the invention should not be based upon the foregoing description. Rather, the scope of the invention should be determined based upon the claims recited herein, including the full scope of equivalents thereof.

While the foregoing is directed to embodiments of the invention, other and further embodiments of the invention may be devised without departing from the basic scope thereof, and the scope thereof is determined by the claims that follow.

The invention claimed is:

1. A method for treating a chamber and depositing a material on a substrate surface, comprising:

exposing inner surfaces of a processing chamber and a substrate disposed within the processing chamber simultaneously to a treatment gas comprising a hydrogenated ligand compound during a pretreatment process, wherein the hydrogenated ligand compound has the chemical formula of HL, wherein the ligand L of the hydrogenated ligand compound is selected from the group consisting of cyclopentadienyl, alkylcyclopentadienyl, pentadienyl, pyrrolyl, isomers thereof, derivatives thereof, and combinations thereof and a coating of the hydrogenated ligand compound is formed on the inner surfaces of the processing chamber during the pretreatment process; and subsequently exposing the substrate to a first precursor gas to deposit a material on the substrate within the processing chamber during a vapor deposition process, wherein the first precursor gas comprises a first precursor having the chemical formula of $ML'_x$, where x is 1, 2, 3, 4, 5, 6, or greater, M is an element selected from the group consisting of Ti, Zr, Hf, Nb, Ta, Mo, W, Ru, Co, Ni, Pd, Pt, Cu, Al, Ga, In, Si, Ge, Sn, P, As, and Sb, and each L' is independently a ligand selected from the group consisting of alkylamino, alkylimino, alkoxy, alkyl, alkene, alkyne, cyclopentadienyl, alkylcyclopentadienyl, pentadienyl, pyrrolyl, hydrogen, halogen, isomers thereof, derivatives thereof, and combinations thereof.

2. The method of claim 1, wherein the ligand L' of the first precursor is selected from the group consisting of cyclopentadienyl, alkylcyclopentadienyl, pentadienyl, pyrrolyl, isomers thereof, derivatives thereof, and combinations thereof.

* * * * *

UNITED STATES PATENT AND TRADEMARK OFFICE
CERTIFICATE OF CORRECTION

PATENT NO. : 8,491,967 B2  
APPLICATION NO. : 12/206705  
DATED : July 23, 2013  
INVENTOR(S) : Ma et al.

Page 1 of 1

It is certified that error appears in the above-identified patent and that said Letters Patent is hereby corrected as shown below:

Title Page, Abstract (57):

Line 3, delete "on a";

In the Specification

Background of the Invention:

Column 1, Line 41, delete "the" after the;

Column 1, Line 42, delete "frequencey" and insert --frequency-- therefor;

Column 1, Line 56, delete "elimante" and insert --eliminate-- therefor;

Detailed Description:

Column 8, Line 50, delete "fro" and insert --for-- therefor;

Column 23, Line 47, delete "a" and insert --α-- therefor;

Column 23, Line 50, delete "a" and insert --α-- therefor;

Column 23, Line 54, delete "a" and insert --α-- therefor;

Column 23, Line 56, delete "a" and insert --α-- therefor;

Column 28, Line 33, delete "a" and insert --α-- therefor;

Column 32, Lines 37-38, delete "suicide" and insert --silicide-- therefor.

Signed and Sealed this  
First Day of October, 2013

Teresa Stanek Rea  
*Deputy Director of the United States Patent and Trademark Office*